(12) United States Patent
Ebihara et al.

(10) Patent No.: US 10,664,432 B2
(45) Date of Patent: May 26, 2020

(54) SEMICONDUCTOR LAYERED DEVICE WITH DATA BUS INVERSION

(71) Applicant: Micron Technology, Inc., Boise, ID (US)

(72) Inventors: Yuki Ebihara, Chofu (JP); Seiji Narui, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/987,895

(22) Filed: May 23, 2018

(65) Prior Publication Data

US 2019/0361835 A1   Nov. 28, 2019

(51) Int. Cl.

| G11C 11/00 | (2006.01) |
| G06F 13/42 | (2006.01) |
| G11C 11/4093 | (2006.01) |
| G11C 11/402 | (2006.01) |
| H01L 27/108 | (2006.01) |

(52) U.S. Cl.
CPC ...... *G06F 13/4265* (2013.01); *G11C 11/4023* (2013.01); *G11C 11/4093* (2013.01); *H01L 27/108* (2013.01)

(58) Field of Classification Search
CPC ............. G06F 13/4265; G11C 11/4023; G11C 11/4093; H01L 27/108
USPC ........................................................ 365/149
See application file for complete search history.

(56) References Cited

U.S. PATENT DOCUMENTS

| 5,272,675 | A | 12/1993 | Kobayashi |
| 5,999,458 | A | 12/1999 | Nishimura et al. |
| 6,367,027 | B1 | 4/2002 | Frankowsky |
| 6,747,625 | B1 | 6/2004 | Han et al. |

(Continued)

FOREIGN PATENT DOCUMENTS

| CN | 105190585 A | 12/2015 |
| CN | 107993684 A | 5/2018 |

(Continued)

OTHER PUBLICATIONS

U.S. Appl. No. 15/217,719, entitled: "Shared Error Detection and Correction Memory", filed Jul. 22, 2017.

(Continued)

*Primary Examiner* — Vu A Le
(74) *Attorney, Agent, or Firm* — Dorsey & Whitney LLP

(57) ABSTRACT

Apparatuses and methods of data transmission between semiconductor chips are described. An example apparatus includes: a data bus inversion (DBI) circuit that receives first, second and third input data in order, and further provides first, second and third output data, either with or without data bus inversion. The DBI circuit includes a first circuit that latches the first input data and the third input data; a second circuit that latches the second input data; a first DBI calculator circuit that performs first DBI calculation on the latched first input data and the latched second input data responsive to the first circuit latching the first input data and the second circuit latching the second input data, respectively; and a second DBI calculator circuit that performs second DBI calculation on the latched second data and the latched third input data responsive to the first circuit latching the third input data.

20 Claims, 20 Drawing Sheets

(56) References Cited

U.S. PATENT DOCUMENTS

| | | |
|---|---|---|
| 6,963,220 B2 | 11/2005 | Momtaz et al. |
| 7,529,890 B1 | 5/2009 | Neuman et al. |
| 7,551,167 B2 | 6/2009 | Park et al. |
| 9,336,383 B2* | 5/2016 | Salamat .................. G06F 21/51 |
| 10,008,287 B2 | 6/2018 | Dono et al. |
| 2007/0226430 A1 | 9/2007 | Dietrich |
| 2008/0247501 A1 | 10/2008 | Zhang |
| 2010/0257495 A1 | 10/2010 | Wu |
| 2010/0332177 A1 | 12/2010 | Wu et al. |
| 2011/0002154 A1 | 1/2011 | Mitani et al. |
| 2011/0184688 A1 | 7/2011 | Uetake et al. |
| 2012/0124532 A1 | 5/2012 | Coteus et al. |
| 2012/0138927 A1 | 6/2012 | Kang |
| 2012/0162836 A1 | 6/2012 | Furuta et al. |
| 2012/0213022 A1 | 8/2012 | Yang et al. |
| 2012/0221927 A1 | 8/2012 | Moon |
| 2012/0224430 A1* | 9/2012 | Visconti ................. G11C 16/10 365/185.19 |
| 2013/0049796 A1 | 2/2013 | Pang et al. |
| 2013/0153898 A1 | 6/2013 | Takahashi et al. |
| 2015/0235715 A1 | 8/2015 | Cho |
| 2016/0141010 A1 | 5/2016 | Yun |
| 2016/0293231 A1* | 10/2016 | Shu .................... G11C 11/4096 |
| 2016/0364348 A1 | 12/2016 | Shu |
| 2017/0337951 A1 | 11/2017 | Hollis et al. |
| 2018/0025789 A1 | 1/2018 | Dono et al. |
| 2018/0301202 A1 | 10/2018 | Dono et al. |

FOREIGN PATENT DOCUMENTS

| | | |
|---|---|---|
| KR | 20150060346 A | 6/2015 |
| TW | 201619836 A | 6/2016 |

OTHER PUBLICATIONS

U.S. Appl. No. 16/163,471, titled "Semiconductor Device With First-In-First-Out Circuit", filed Oct. 17, 2018.

U.S. Appl. No. 16/436,767 titled "Shared Error Detection and Correction Memory", filed Jun. 10, 2019.

International Search Report and Written Opinion dated Sep. 6, 2019 for PCT Application No. PCT/US2019/031754.

TW Office Action for Application No. 108115190, dated Feb. 21, 2020.

* cited by examiner

SEMICONDUCTOR LAYERED DEVICE WITH DATA BUS INVERSION

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips (e.g., dies) vertically and interconnecting the chips using through substrate vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

For example, High Bandwidth Memory (HBM) is a type of memory including a high-performance DRAM interface chip and vertically stacked DRAM chips. A typical HBM stack of four DRAM chips (e.g., core chips) has two 128-bit channels per chip for a total of eight input/output channels and a width of 1024 bits in total. An interface (IF) chip of the HBM provides an interface with the eight input/output channels, which function independently of each other. In the HBM, data transmission between chips (e.g., between an interface chip and core chips) via through substrate vias (TSVs) may cause high power consumption, due to current charge and discharge at the TSVs as capacitors.

3D memory devices (e.g., HBM and the like) support data bus inversion ("DBI") during write and read operation for reducing currents in data transmission between a host controller and chips (e.g., dies) via a data bus. One of DBI algorithms, DBI-AC algorithm, is used to limit the number of simultaneously transitioning data bits (e.g., a half of bits or fewer) across the width of the interface. Under the DBI-AC algorithm, all the bits of current data to be transmitted are inverted in logic level prior to transmission of the current data, if a majority of bits of the current data are different in logic level from previous data (e.g., immediately preceding data) transmitted one data transmission cycle before the current data without inversion. If the previous data was transmitted with inversion, however, the current data is transmitted as is, even if the majority of bits of the current data are different in logic level from the previous data.

DBI calculation is performed to detect whether the majority bits of the current data are different in logic level from the previous data. Based on the majority bits' transitions based on the DBI calculation result and previous execution status of the DBI operation, a DBI bit indicating whether the DBI is executed on the current data. In FIG. 1A, the DBI bit represents "1," if the majority bits of the current data are different in logic level from the previous data and the DBI was not executed on the previous data, and the DBI bit represents "0" if the majority of the bits of the current data are the same in logic level from the previous data. As shown in FIG. 1B, a DBI circuit 1 for data read path executes the DBI-AC algorithm and provides the current data with or without DBI and a DBI bit onto data bus. A data bus transmits each data from DRAM core in synchronous to a read clock signal READ. In response to each cycle of the read clock signal READ, a D-type flip-flop circuit 11 captures a data (DQ) and a DBI bit and provides the captured data (DQ) as previous data which with one cycle delay and the DBI bit and to a DBI calculator 12 that is a comparator. The DBI calculator 12 receives the current data from the DRAM core and the previous data that is the data one cycle before the current data from the flip-flop circuit 11. The DBI calculator 12 compares the previous data and the current data to determine whether a majority of bits in the data are different in logic level from the previous data (e.g., the number of bits showing difference is greater than four bits, if the width of the data bus is eight bits), and provides a DBI calculation result bit to a logic AND circuit 13. The logic AND circuit 13 receives the DBI calculation result and a DBI enable/disable bit from a mode register and provides the DBI bit to a logic XOR circuit 14. The DBI bit is active (e.g., "1") when both the DBI calculation result is indicative of the majority of bits in the current data being different from the previous data and the DBI enable/disable bit is indicative of the DBI operation enabled. The logic XOR circuit 14 executes inversion of the current data if the DBI bit is active (e.g., "1"), thus the DBI circuit 1 provides a combination of the inverted current data DQ and the DBI bit "1," or a combination of the current data DQ and the DBI bit "0." The DBI calculation is supposed to be executed within one cycle of the read clock signal READ; however, completion of DBI calculation takes relative long time because the DBI calculator 12 is composed of a large number of logic gates. Thus, a cycle of the read clock signal READ has been required to be sufficiently long to complete the DBI computation, and thus a data transfer speed with the DBI operations has been suppressed.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments of the disclosure may be practiced. The specification provides sufficient detail to enable those skilled in the art to practice embodiments of the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

Figure 1A:
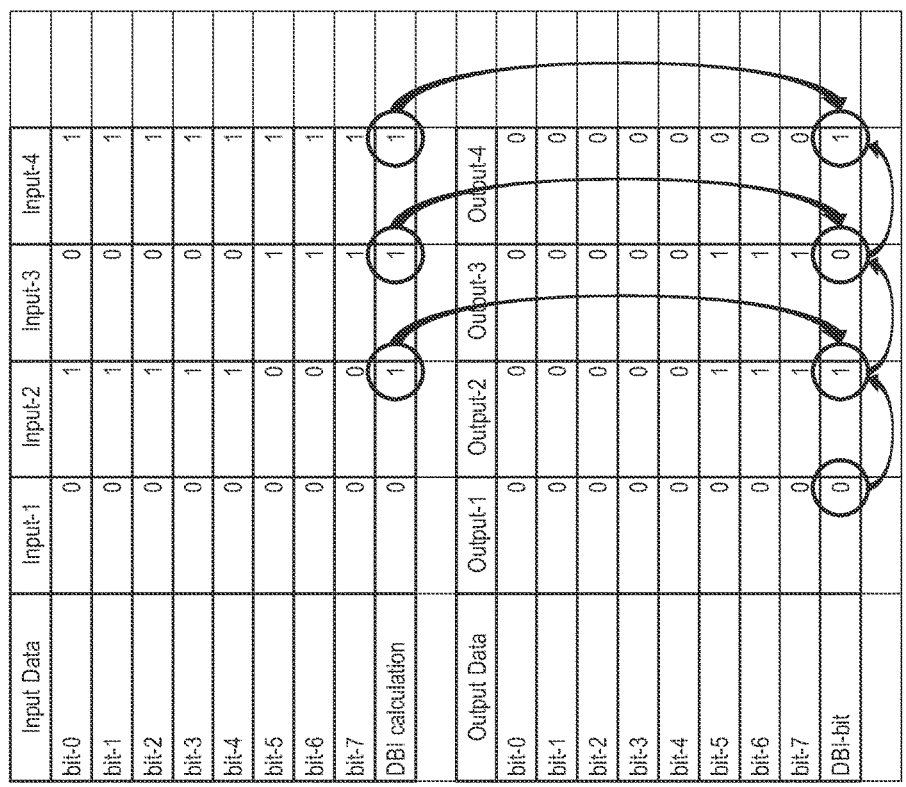
FIG. 1A is a truth table indicative of an operation of a DBI circuit according to the prior art.
Figure 1B:
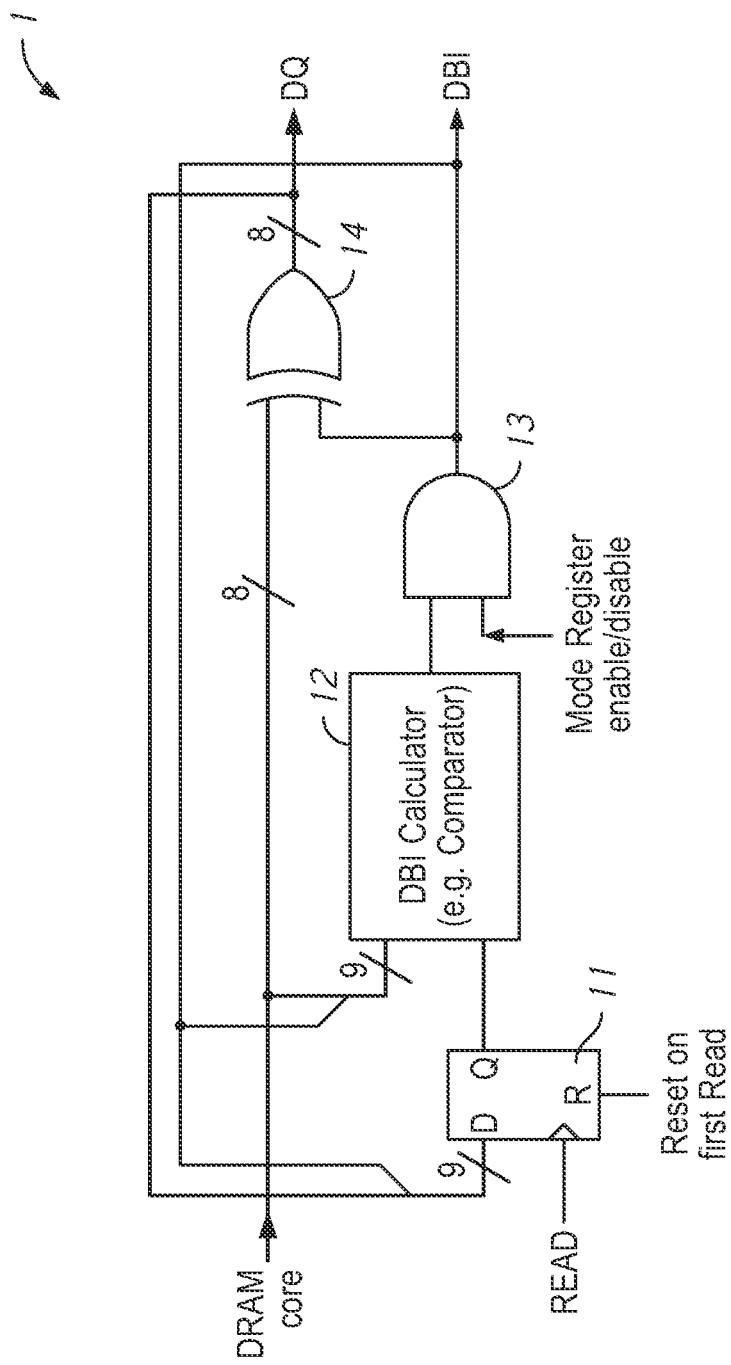
FIG. 1B is a schematic diagram of the DBI circuit according to the prior art.
Figure 2A:
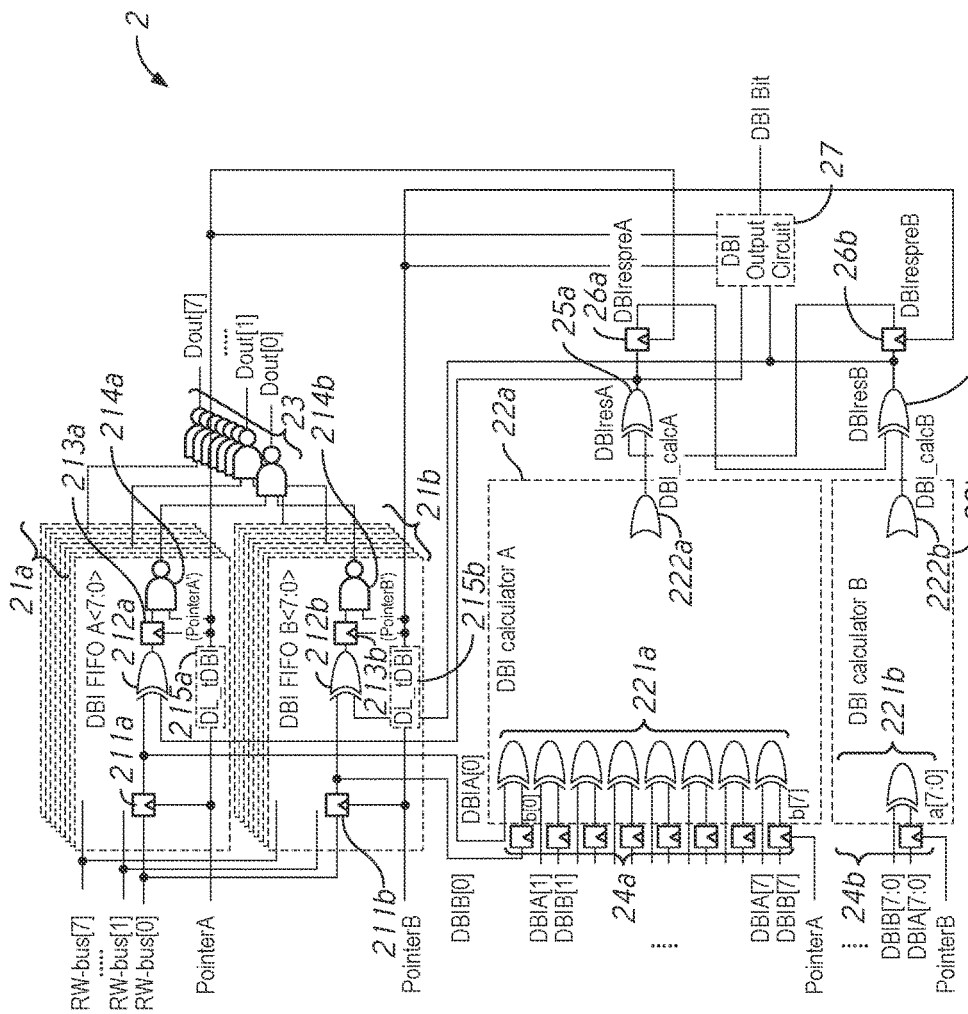
FIG. 2A is a schematic diagram of a DBI circuit in accordance with an embodiment of the present disclosure.
Figure 2B:
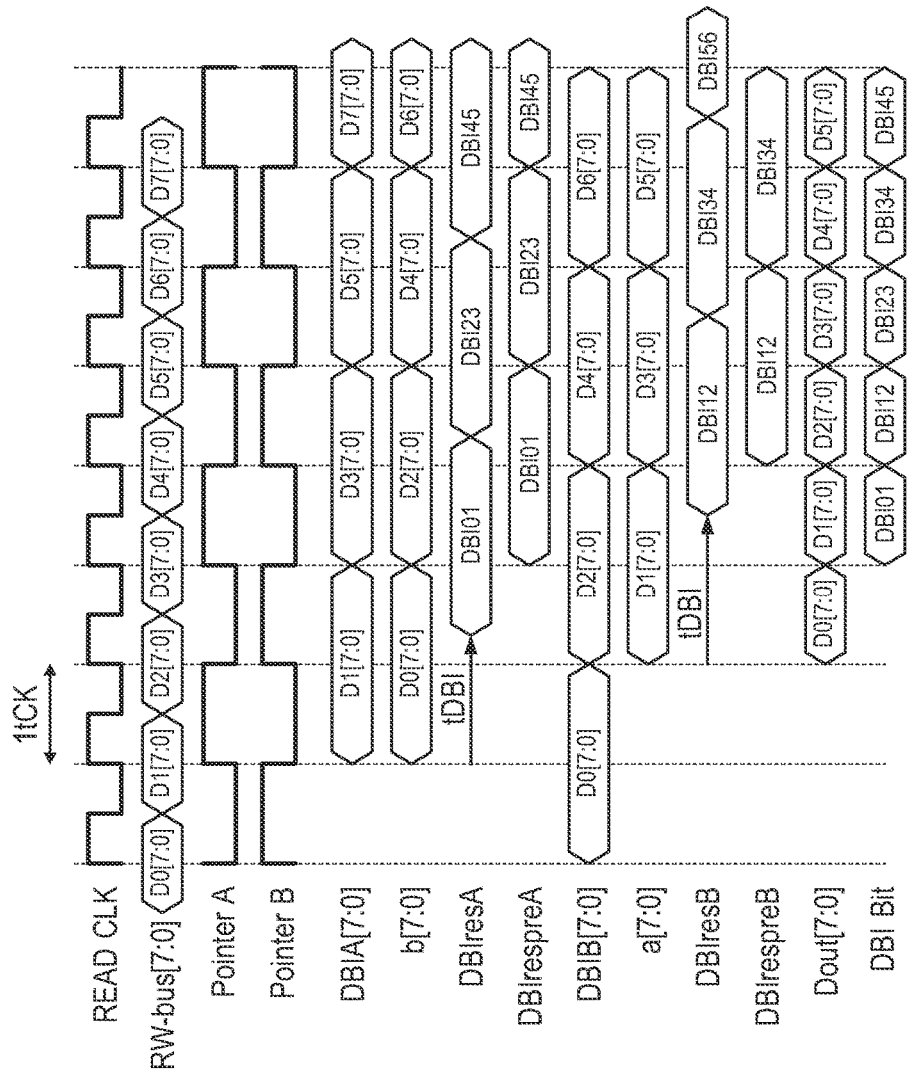
FIG. 2B is a timing diagram of signals in the DBI circuit during a DBI operation in accordance with an embodiment of the present disclosure.

FIG. 2A is a schematic diagram of a DBI circuit 2 in accordance with an embodiment of the present disclosure. FIG. 2B is a timing diagram of signals in the DBI circuit 2 during a DBI operation in accordance with an embodiment of the present disclosure. The DBI circuit 2 may include a plurality of DBI FIFO A circuits <7:0> 21a and a plurality of DBI FIFO B circuits <7:0> 21b provided for each bit of an input data, a DBI calculator A 22a and a DBI calculator B 22b. For example, a DBI calculation cycle (tDBI) in the DBI calculators A and B 22a and 22b may be between one clock cycle (1tCK) and two clock cycles (2tCK) of a read clock signal READ. The plurality of DBI FIFO A circuits <7:0> 21a and the plurality of DBI FIFO B circuits <7:0> 21b both may receive corresponding bits of data (e.g., in order of D0, D1, D2, D3, D4, D5, D6, D7) from an input data bus, such as RW-bus [7:0] respectively at every read clock cycle (1tCK) of the read clock signal READ. The plurality of DBI FIFO A circuits <7:0> 21a and the plurality of DBI FIFO B circuits <7:0> 21b may receive pointer signals PointerA and PointerB respectively. The PointerA signal and the PointerB signal are periodic signals that may have a pulse width of one clock cycle (=1tCK) of the read clock signal READ, and they are complementary to each other. Thus, PointerA signal and the PointerB signal may alternate their active states (e.g., a logic high level) and data may be latched at every other cycles (e.g., odd cycles only, or even cycles only) by the pointer signals PointerA and PointerB. The DBI calculator A 22a and the DBI calculator B 22b may perform DBI calculation to detect whether the majority bits of the current data are different in logic level from the previous data. The DBI calculator B 22b may include similar components in a similar structural configuration as the DBI calculator A 22a, and detailed illustration of the DBI calculator B 22b is omitted in FIG. 2A.

Each DBI FIFO A circuit of the plurality of DBI FIFO A circuits <7:0> 21a includes a flip-flop circuit 211a, a bit inverter (e.g., exclusive-OR (XOR) gate) 212a, a flip-flop circuit 213a, and a NAND circuit 214a. Each DBI FIFO A circuit of the plurality of DBI FIFO A circuits <7:0> 21a may also include a delay circuit DL_tDBI 215a as shown in FIG. 2A. Each DBI FIFO B circuit of the plurality of DBI FIFO B circuits <7:0> 21b includes a flip-flop circuit 211b, a bit inverter (e.g., XOR gate) 212b, a flip-flop circuit 213b, and a NAND circuit 214b. Each DBI FIFO B circuit of the plurality of DBI FIFO B circuits <7:0> 21b may also include a delay circuit DL_tDBI 215b as shown in FIG. 2A. The plurality of DBI FIFO A circuits <7:0> 21a and the plurality of DBI FIFO B circuits <7:0> 21b may provide FIFO output signals to a plurality of output circuits 23, in synchronous to DBI bit signals by holding for a number of clock cycles of the read clock signal READ corresponding to DBI calculation time (tDBI).

For example, the flip-flop circuits 21b of the DBI FIFO B circuits <7:0> 21b may latch corresponding bits of the data on the corresponding RW-bus[7:0] at even cycles (e.g., D0, D2, D4, D6 in FIG. 2B) responsive to the PointerB signal in the active state (e.g., at a logic high level), and provide latched data signals DBIB[7:0]. The bit inverter 212b of each DBI FIFO B circuit 21b may receive a corresponding bit of the latched data signals DBIB[7:0] and a current DBI calculation result signal DBIresB from a comparator circuit 25b coupled to the DBI calculator B 22b. If the current DBI calculation result signal DBIresB is active, the bit inverter 212b may provide an inverted bit of the corresponded bit of the latched data signals DBIB[7:0]. If the current DBI calculation result signal DBIresB is inactive (e.g., at a logic low level), the bit inverter 212b may provide the corresponded bit of the latched data signals DBIB[7:0]. The flip-flop circuit 213b of each DBI FIFO B circuit 21b may latch an output signal of the bit inverter 212b and the NAND circuit 214b of each DBI FIFO B circuit 21b may provide an inverted signal of the output signal of the bit inverter 212b as a FIFO output signal, if the pointer signal PointerB is in the active state. If the DBI FIFO B circuit 21b includes the delay circuit DL tDBI circuit 215b, the delay circuit DL_t-DBI circuit 215b may provide a delayed pointer signal PointerB' that may have a delay of the DBI calculation cycle (tDBI) with reference to the pointer signal PointerB instead of the pointer signal PointerB to the flip-flop circuit 213b and the NAND circuit 214b.

Similarly, the flip-flop circuits 211a of the DBI FIFO A circuits <7:0> 21a may latch corresponding bits of the data on the corresponding RW-bus[7:0] at odd cycles (e.g., D1, D3, D5, D7 in FIG. 2B), immediately following the corresponding bits of the data on RW-bus[7:0] received by the DBI FIFO B circuits <7:0> 21b at even cycles (e.g., D0, D2, D4, D6 in FIG. 2B), responsive to the PointerA signal in the active state (e.g., at a logic high level), and provide latched data signals DBIA[7:0]. The bit inverter 212a of each DBI FIFO A circuit 21a may receive a corresponding bit of the latched data signals DBIA[7:0] and a current DBI calculation result signal DBIresA from a comparator circuit 25a coupled to the DBI calculator A 22a. If the current DBI calculation result signal DBIresA is active, the bit inverter 212a may provide an inverted bit of the corresponded bit of the latched data signals DBIA[7:0]. If the current DBI calculation result signal DBIresA is inactive (e.g., at a logic low level), the bit inverter 212a may provide the corresponded bit of the latched data signals DBIA[7:0]. The flip-flop circuit 213a of each DBI FIFO A circuit 21a may latch an output signal of the bit inverter 212a. The NAND circuit 214a of each DBI FIFO A circuit 21a may provide an inverted signal of the output signal of the bit inverter 212a as the FIFO output signal if the pointer signal PointerA is in the active state. If the DBI FIFO A circuit 21a includes the delay circuit DL_tDBI circuit 215a, the delay circuit DL_t-DBI circuit 215a may provide a delayed pointer signal PointerA' that may have a delay of a DBI calculation cycle (tDBI) with reference to the pointer signal PointerA instead of the pointer signal PointerA to the flip-flop circuit 213a and the NAND circuit 214a. The plurality of output circuits 23 may receive the FIFO output signals of the corresponding NAND circuits 214a and 214b and provide data output signals Dout [7:0].

The DBI calculator A 22a may receive the latched data signals DBIA[7:0] from the flip-flop circuits 211a of the DBI FIFO A circuits <7:0> 21a. The DBI calculator A 22a may also receive data signals b[7:0] from a plurality of flip-flop circuits 24a. The plurality of flip-flop circuits 24a may receive the latched data signals DBIB[7:0] from the flip-flop circuits 21b of the DBI FIFO B circuits <7:0> 21b and the pointer signal PointerA, and latch the latched data signals DBIB[7:0] respectively to provide the data signals b[7:0]. The DBI calculator A 22a may include a plurality of comparator circuits 221a. For example, the plurality of comparator circuits 221a may be XOR circuits. Each comparator circuit of the plurality of comparator circuits 221a may receive a corresponding bit of the data signals b[7:0] and a corresponding bit of the latched data signals DBIA [7:0] and provide a result signal for each corresponding bit. For example, the result signal may be an active state (e.g., "1" or a logic high level), if the corresponding bit of the data signals b[7:0] and the corresponding bit of the latched data signals DBIA[7:0] are different, which indicates that the corresponding bits of the previous data and the current data are different. Similarly, the result signal may be an inactive state (e.g., "0" or a logic low level), if the corresponding bit of the data signals b[7:0] and the corresponding bit of the latched data signals DBIA[7:0] are the same, which indicates that the corresponding bits of the previous data and the current data are the same. The DBI calculator A 22a may include an adder circuit 222a. For example, the adder circuit 222a may be an OR circuit. The adder circuit 222a may receive calculation signals after calculations based on the result signals from the plurality of comparator circuits 221a and may provide a DBI calculation signal DBI_calcA. Calculations based on the result signals will be described in detail with reference to FIG. 3. The comparator circuit 25a may receive the DBI calculation signal DBI_calcA and a previous DBI calculation result signal DBIrespreB from a flip-flop circuit 26b based on DBI calculation by the DBI calculator B 22b. If the DBI calculation signal DBI_calcA and the previous DBI calculation result signal DBIrespreB are different, the comparator circuit 25a may provide the current DBI calculation result signal DBIresA in an active state (e.g., "1" or a logic high level). If the DBI calculation signal DBI_calcA and the previous DBI calculation result signal DBIrespreB are the same, the comparator circuit 25a may provide the current DBI calculation result signal DBIresA in an inactive state (e.g., "0" or a logic low level). A flip-flop circuit 26a may receive the current DBI calculation result signal DBIresA and latch the current DBI calculation result signal DBIresA with the pointer signal PointerA or the delayed pointer signal PointerA' and may provide the latched current DBI calculation result signal DBIresA as a previous DBI calculation result signal DBIrespreA.

Similarly, the DBI calculator B 22b may receive the latched data signals DBIB[7:0] from the flip-flop circuits 211b of the DBI FIFO B circuits <7:0> 21b. The DBI calculator B 22b may also receive data signals a[7:0] from a plurality of flip-flop circuits 24b that may function as a plurality of pre-DBI latch circuits. The plurality of flip-flop circuits 24b may receive the latched data signals DBIA[7:0] from the flip-flop circuits 211a of the DBI FIFO A circuits <7:0> 21a and the pointer signal PointerB, and latch the latched data signals DBIA[7:0] respectively to provide the data signals a[7:0]. The DBI calculator B 22b may include a plurality of comparator circuits 221b. For example, the plurality of comparator circuits 221b may be XOR circuits. Similarly, each comparator circuit of the plurality of comparator circuits 221b may receive a corresponding bit of the data signals a[7:0] and a corresponding bit of the latched data signals DBIB[7:0] and provide a result signal for each corresponding bit, such that the result signal may be the active state (e.g., "1" or the logic high level), if the corresponding bit of the data signals a[7:0] and the corresponding bit of the latched data signals DBIB[7:0] are different and the result signal may be the inactive state (e.g., "0" or the logic low level), if the corresponding bit of the data signals a[7:0] and the corresponding bit of the latched data signals DBIB[7:0] are the same. The DBI calculator B 22b may include an adder circuit 222b. For example, the adder circuit 222b may be an OR circuit. The adder circuit 222b may receive calculation signals after calculations based on the result signals from the plurality of comparator circuits 221b and may provide a DBI calculation signal DBI_calcB. Calculations based on the result signals will be described in detail with reference to FIG. 3. The comparator circuit 25b may receive the DBI calculation signal DBI_calcB and a previous DBI calculation result signal DBIrespreA from the flip-flop circuit 26a based on DBI calculation of the DBI calculator A 22a. If the DBI calculation signal DBI_calcB and the previous DBI calculation result signal DBIrespreA are different, the comparator circuit 25b may provide the current DBI calculation result signal DBIresB in an active state (e.g., "1" or the logic high level). If the DBI calculation signal DBI_calcB and the previous DBI calculation result signal DBIrespreA are the same, the comparator circuit 25b may provide the current DBI calculation result signal DBIresB in an inactive state (e.g., "0" or a logic low level). A flip-flop circuit 26b may receive the current DBI calculation result signal DBIresB and latch the current DBI calculation result signal DBIresB with the pointer signal PointerB or the delayed pointer signal PointerB' and may provide the latched current DBI calculation result signal DBIresB as the previous DBI calculation result signal DBIrespreB.

The DBI circuit 2 may also include a DBI output circuit 27. The DBI output circuit 27 may receive the current DBI calculation result signals DBIresA and DBIresB and the pointer signals PointerA and PointerB or the delayed pointer signals PointerA' and PointerB'. The DBI output circuit 27 may provide DBIresA as a DBI bit signal responsive to the pointer signal PointerA (or the delayed pointer signal PointerA') and may provide DBIresB as the DBI bit signal responsive to the pointer signal PointerB (or the delayed pointer signal PointerB'). Because the pointer signals PointerA and PointerB, or the delayed pointer signals PointerA' and PointerB' are complementary periodic signals, either DBIresA or DBIresB may be provided as the DBI bit signal at odd cycles or even cycles, respectively.

Figure 3:
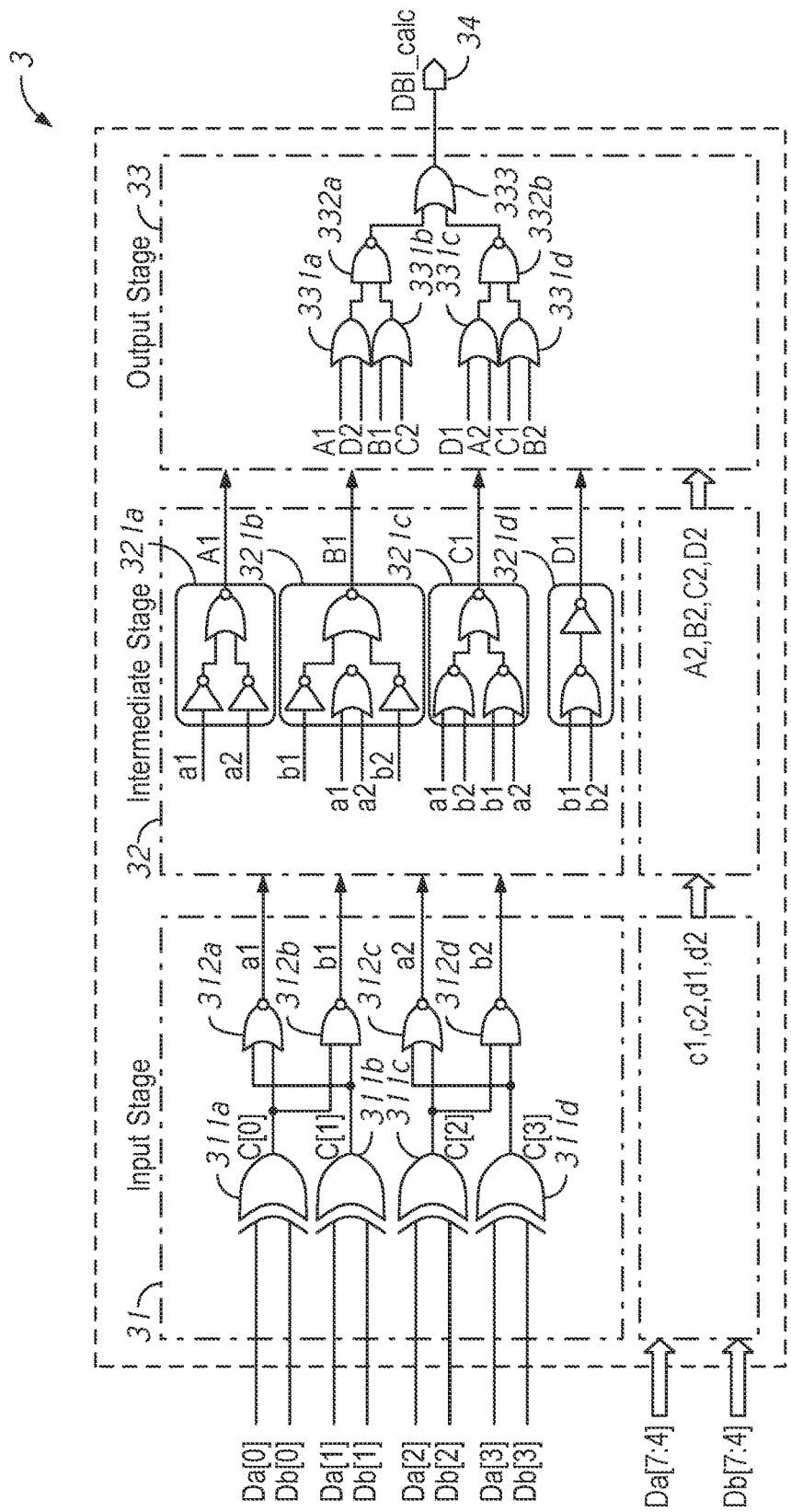
FIG. 3 is a DBI calculator circuit in accordance with an embodiment of the present disclosure.

FIG. 3 is a DBI calculator circuit 3 in accordance with an embodiment of the present disclosure. For example, the DBI calculator circuit 3 may be used as the DBI calculator circuits 22a and 22b in FIG. 2A. The DBI calculator circuit 3 may perform DBI calculation to detect whether the majority bits of the current data are different in logic level from the previous data. The DBI calculator circuit 3 may include an input stage 31, an intermediate stage 32 and an output stage 33. The input stage 31 of the DBI calculator circuit 3 may include a plurality of comparator circuits 311a to 311d for corresponding bits (e.g., Da[3:0]) of current data and corresponding bits (e.g., Db[3:0]) of the previous data. For example, the plurality of comparator circuits 311a to 311d may be logic XOR circuits. For example, a comparator circuit 311a may receive Da[0] bit of the current data and Db[0] bit of the previous data and provide a change bit C[0] indicative of whether a corresponding bit D[0] is changed from the previous data to the current data. The change bit C[0] is in an active state (e.g., a logic high level) if the corresponding bit D[0] is changed, because Da[0] bit of the current data and Db[0] bit of the previous data are different. Similarly, comparator circuits 311b to 311d may compare Da[1:3] bits and Db[1:3] bits and provide C[1:3] representing whether corresponding bits D[1:3] are changed. The input stage 31 of the DBI calculator circuit 3 may also include logic circuits 312a to 312d. For example, the logic circuit 312a may be a logic NOR circuit which may receive C[0] and C[1] and may provide an intermediate signal a1 that is a NOR operation of C[0] and C[1] indicating whether any of the bits D[0:1] is changed. For example, the intermediate signal a1 represents "1 (=at logic high level)" if none of the bits D[0:1] is changed. The logic circuit 312b may be a logic NAND circuit which may receive C[0] and C[1] and may provide an intermediate signal b1 that is a NAND operation of C[0] and C[1] indicating whether all the bits D[0:1] is changed. For example, the intermediate signal b1 represents "1" if any of the bits D[0:1] is unchanged. Similarly, the logic circuit 312c and the logic circuit 312d may be a logic NOR circuit and a logic NAND circuit which may receive C[2] and C[3] and may provide intermediate signals a2 and b2 that are a NOR operation and a NAND operation of C[2] and C[3].

The intermediate stage 32 of the DBI calculator circuit 3 may include a plurality of logic circuits 321a to 321d. The logic circuit 321a may receive the intermediate signals a1 and a2, invert the intermediate signals a1 and a2, and execute an NOR operation to the inverted intermediate signals a1' and a2' to provide another intermediate signal A1 that is indicative whether none of the bits D[0:3] is changed (e.g., A1 represents "l" if none of the bits D[0:3] is changed). The logic circuit 321b may receive the intermediate signals a1, a2, b1 and b2, invert the intermediate signals b1 and b2, execute an NOR operation to the intermediate signals a1 and a2, and may further execute an NOR operation of the inverted intermediate signals of b1 and b2 and the NOR value of the intermediate signals a1 and a2 to provide another intermediate signal B1 that is indicative whether a number of bits changed in the bits D[0:3] is limited to 1 (e.g., B1 represents "1" if the number of changed bits is 0 or 1). The logic circuit 321c may receive the intermediate signals a1, a2, b1 and b2, execute an NOR operation to the intermediate signals a1 and b2, execute another NOR operation to the intermediate signals a2 and b1, and further execute an NOR operation to the NOR value the intermediate signals a1 and b2 and the NOR value of the intermediate signals a2 and b1 and provide another intermediate signal C1 that is indicative whether the number of bits changed in the bits D[0:3] is limited to 2 (e.g., C1 represents "1" if the number of changed bits is either 0, 1 or 2). The logic circuit 321d may receive the intermediate signals b1 and b2, execute an NOR operation to the intermediate signals b1 and b2, and further invert the NOR value and provide the inverted NOR value as another intermediate signal D1 that is indicative whether the number of bits changed in the bits D[0:3] is limited to 3 (e.g., C1 represents "0" if the number of changed bits is 4). Thus, the intermediate signals A1, B1, C1 and D1 may represent whether the number of bits changed in the bits D[0:3] is limited to 0, 1, 2 and 3, respectively. Similarly, from Da[7:4] and Db[7:4], the input stage 31 may provide the intermediate signals c1, c2, d1 and d2 and the intermediate stage 32 may provide intermediate signals A2, B2, C2 and D2 that may represent whether the number of bits changed in the bits D[4:7] is limited to 0, 1, 2 and 3, respectively.

The output stage 33 may be an evaluation circuit. For example, the evaluation circuit 33 may include a plurality of logic circuits 331a to 331d, another plurality of logic circuits 332a and 332b, and an output logic circuit (e.g., OR gate) 333. For example, the plurality of logic circuits 331a to 331d may be logic OR circuits, the plurality of logic circuits 332a and 332b may be logic NAND circuits, and the output logic circuit may be a logic OR circuit. The logic circuit 331a may receive the intermediate signals A1 and D2 and provide an OR value of the intermediate signals A1 and D2 to the logic circuit 332a. The logic circuit 331b may receive the intermediate signals B1 and C2 and provide an OR value of the intermediate signals B1 and C2 to the logic circuit 332a. Similarly, the logic circuit 331c may provide an OR value of the intermediate signals D1 and A2 to the logic circuit 332b, and the logic circuit 331d may provide an OR value of the intermediate signals C1 and B2 to the logic circuit 332b. The logic circuits 332a and 332b may execute NAND operations and provide results to the output logic circuit 333. The output logic circuit 333 may receive output signals from the logic circuits 332a and 332b and provide a DBI calculation result signal DBI_calc. For example, the DBI calculation result signal DBI_calc may be in an active state (e.g., a logic high level) if the majority of the bits (e.g., five or more bits) of the current data are different in logic level from the previous data, and the DBI calculation result signal DBI-_calc may be in an inactive state (e.g., a logic low level) if the majority of the bits of the current data are not different in logic level from the previous data (e.g., four bits or fewer changed). For example, each comparator of the plurality of comparators 311 in the input stage 31 of the DBI calculator circuit 3 of FIG. 3 may correspond to each comparator of the plurality of comparator circuits 221a (or 221b) of the DBI calculator A 22a (or the DBI calculator B 22b) of FIG. 2A. For example, the output logic circuit 333 of the output stage 33 of the DBI calculator circuit 3 of FIG. 3 may correspond to the adder circuit 222a (or the adder circuit 222b) of the DBI calculator A 22a (or the DBI calculator B 22b) of FIG. 2A.

Figure 4A:
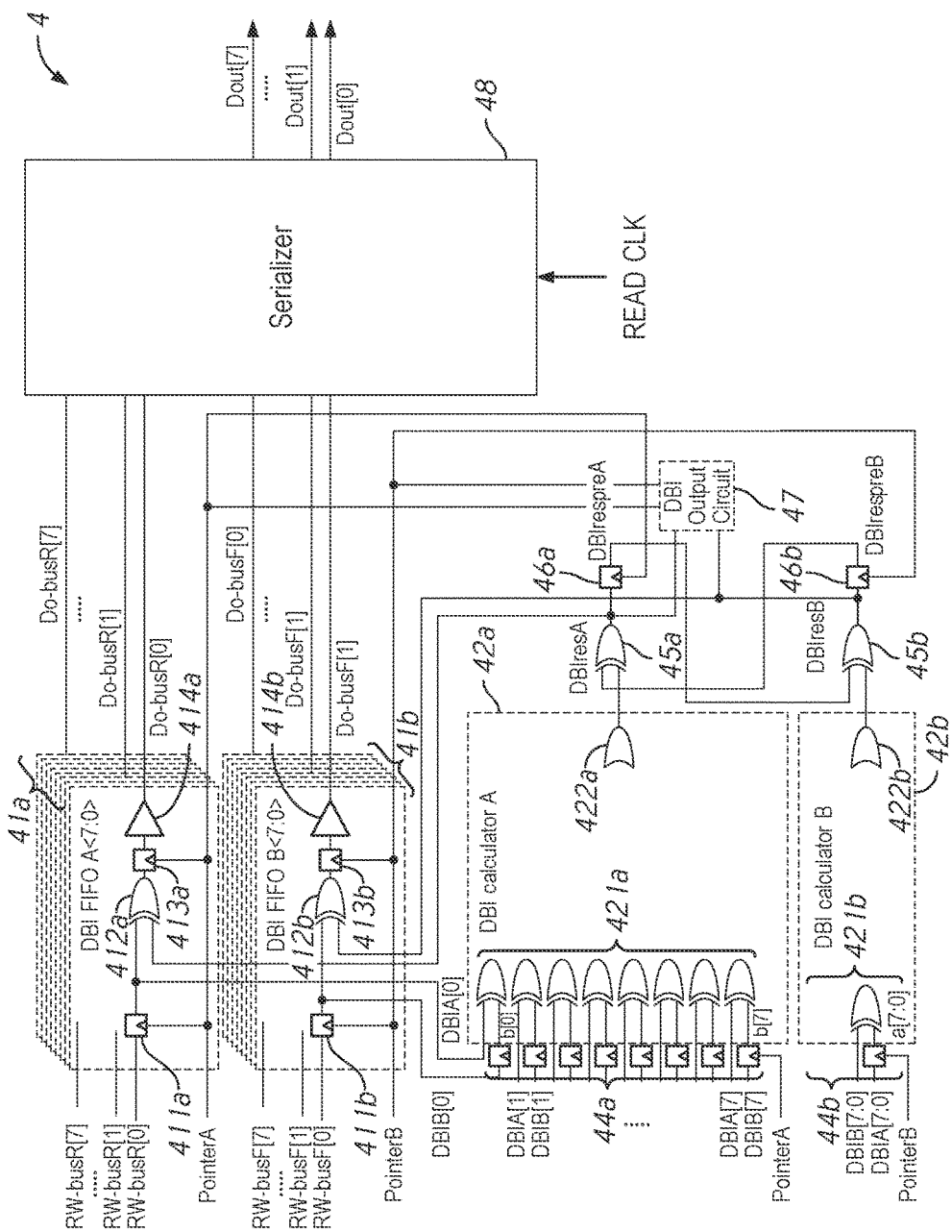
FIG. 4A is a schematic diagram of a DBI circuit in accordance with an embodiment of the present disclosure.
Figure 4B:
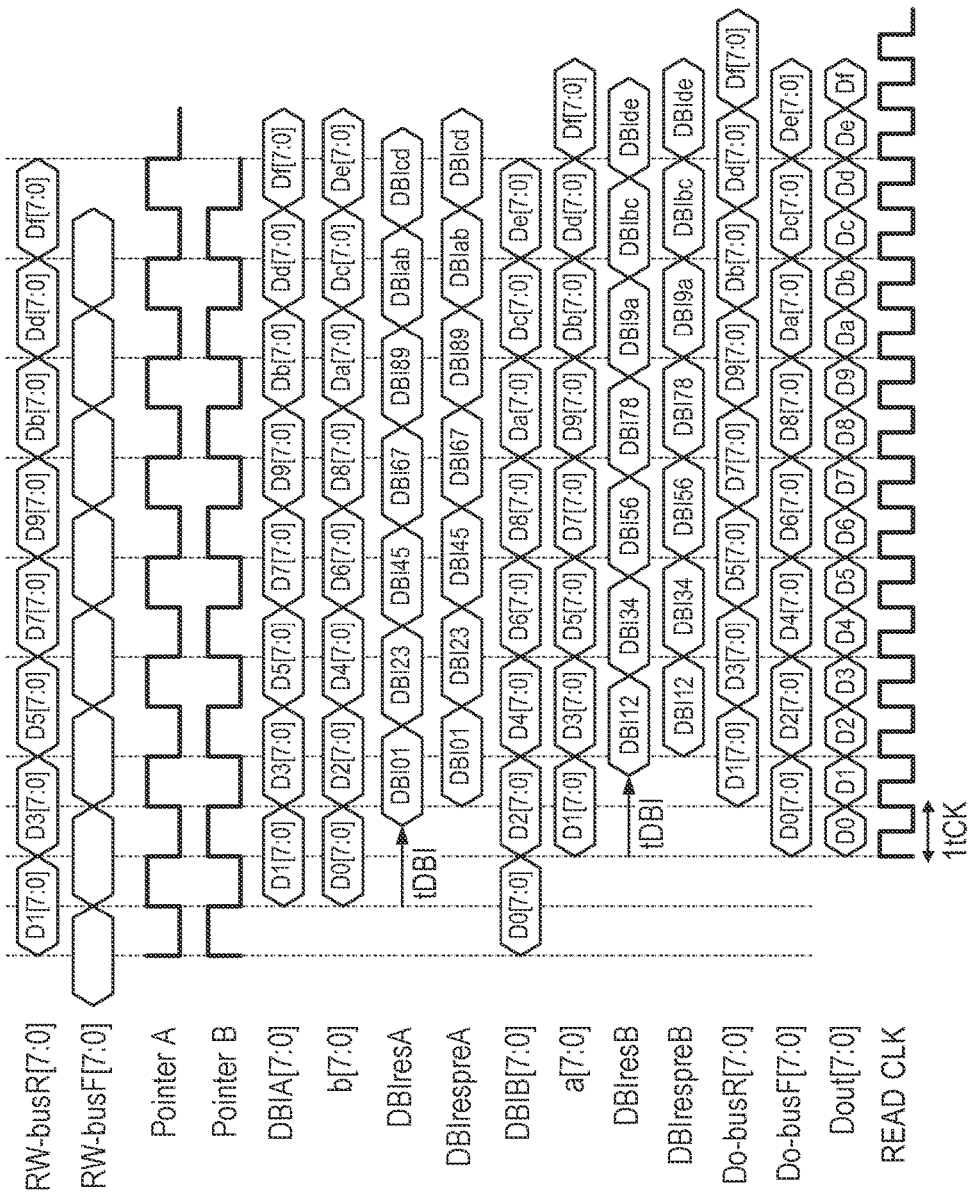
FIG. 4B is a timing diagram of signals in the DBI circuit during a DBI operation in accordance with an embodiment of the present disclosure.

FIG. 4A is a schematic diagram of a DBI circuit 4 in accordance with an embodiment of the present disclosure. FIG. 4B is a timing diagram of signals in the DBI circuit 4 during a DBI operation in accordance with an embodiment of the present disclosure. Description of components corresponding to components included in FIG. 2A will not be repeated and changes from FIG. 2A, including configuration of a plurality of read/write busses will be described. Unlike the RW-bus[7:0] in FIG. 2B that may transmit the data (e.g., in order of D0, D1, D2, D3, D4, D5, D6, D7, D8, . . . ) at every clock cycle (1tCK), there may be a plurality of input data buses, such as RW-busR[7:0] and RW-busF[7:0] in FIG. 4B, both may transmit data of every other data alternatingly every two clock cycles (2tCK) of a read clock signal READ. For example, RW-busR[7:0] may transmit data of odd cycles (e.g., in order of D1, D3, D5, D7, D9, Db, Dd and Df) and RW-busF[7:0] may transmit data of even cycles (e.g., in order of D0, D2, D4, D6, D8, Da, Dc and De). A plurality of DBI FIFO A circuits <7:0> 41a may receive corresponding bits of data (e.g., in order of D1, D3, D5, D7, D9, Db, Dd and Df) from RW-busR[7:0] respectively at every other read clock cycle (2tCK) of the read clock signal READ and a plurality of DBI FIFO B circuits <7:0>41b may receive corresponding bits of data (e.g., in order of D0, D2, D4, D6, D8, Da, Dc and De) from RW-busF[7:0] respectively at every other read clock cycle (2tCK) of the read clock signal READ. The plurality of DBI FIFO A circuits <7:0>41a may include a buffer 414a, instead of the NAND circuit 214a, that may provide Do_busR[7:0] signals. The plurality of DBI FIFO B circuits <7:0>41b may include a buffer 414b, instead of the NAND circuit 214b, that may provide Do_busF[7:0] signals. The DBI circuit 4 may further include a serializer circuit 48 that may receive the Do_busR[7:0] signals and Do_busF[7:0] signals and may provide data output signals Dout [7:0] including data on the Do_busR[7:0] signals and data on the Do_busF[7:0] signals alternatingly in series responsive to the read clock signal READ in order of D0, D1, D2, D3, D4, D5, D6, D7, D8, D9, Da, Db, Dc, Dd, De and Df.

Figure 5A:
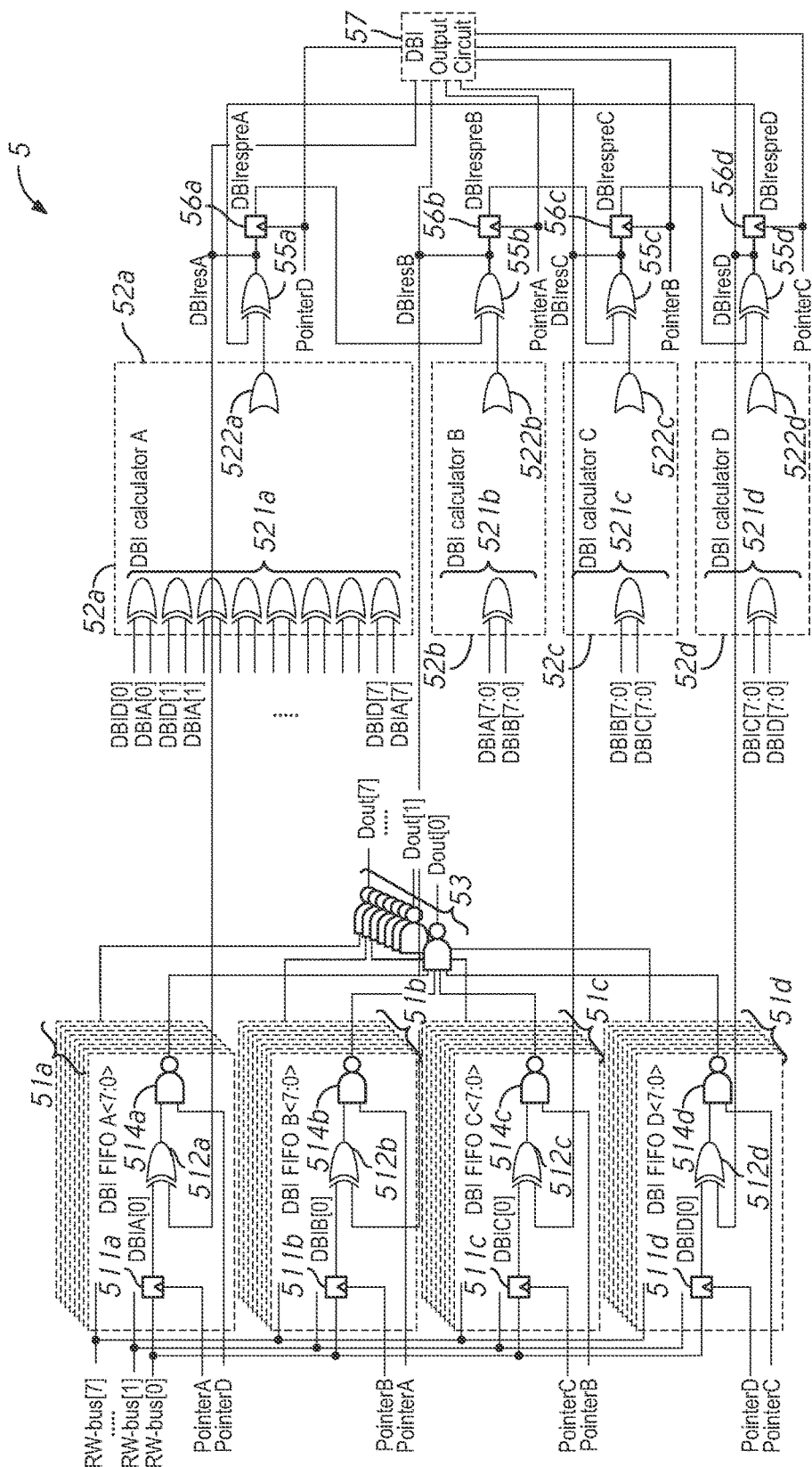
FIG. 5A is a schematic diagram of a DBI circuit in accordance with an embodiment of the present disclosure.
Figure 5B:
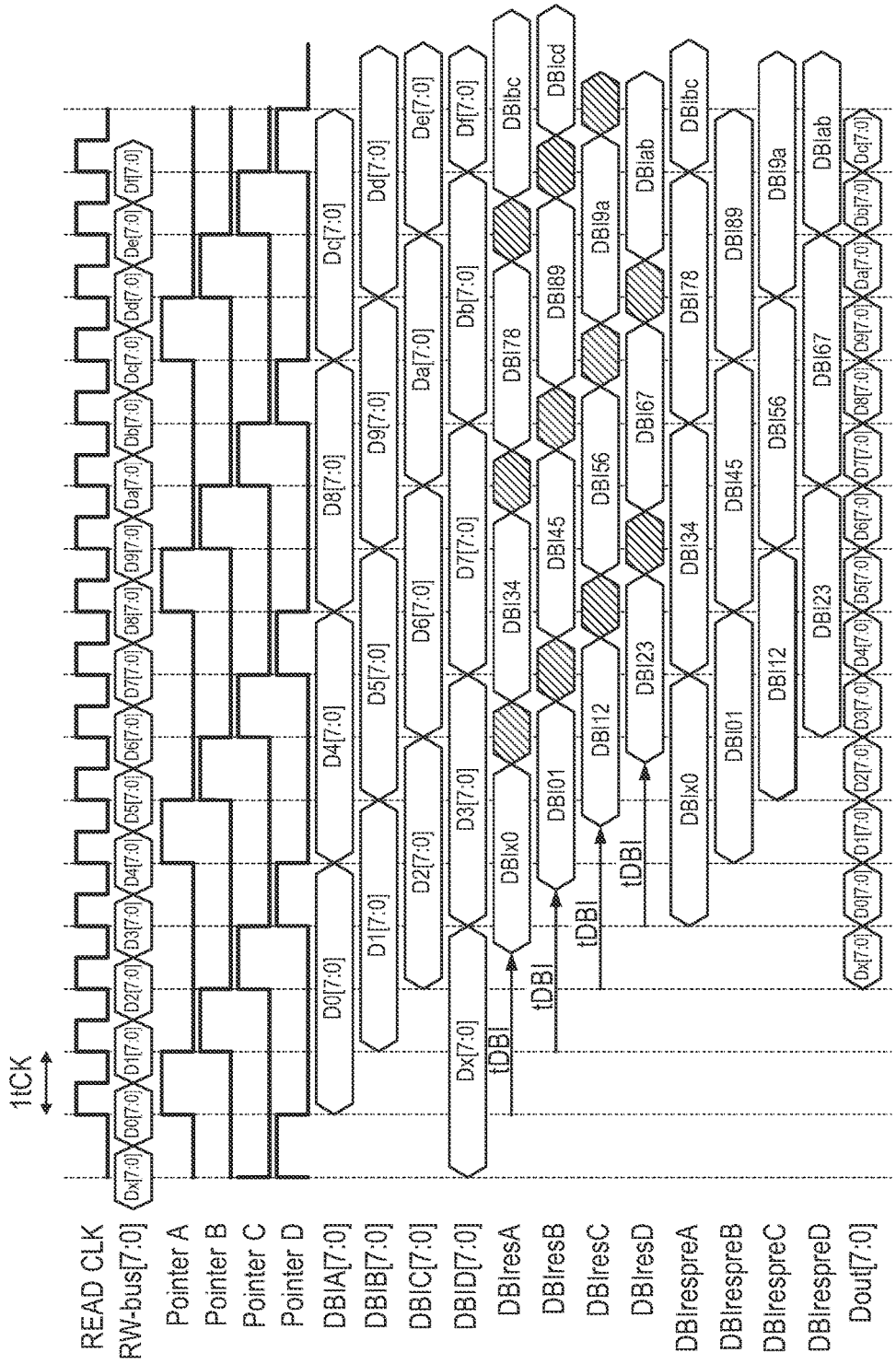
FIG. 5B is a timing diagram of signals in the DBI circuit during a DBI operation in accordance with an embodiment of the present disclosure.

FIG. 5A is a schematic diagram of a DBI circuit 5 in accordance with an embodiment of the present disclosure. FIG. 5B is a timing diagram of signals in the DBI circuit 5 during a DBI operation in accordance with an embodiment of the present disclosure. The DBI circuit 5 may include a plurality of DBI FIFO A circuits <7:0> 51a, a plurality of DBI FIFO B circuits <7:0> 51b, a plurality of DBI FIFO C circuits <7:0> 51c and a plurality of DBI FIFO D circuits <7:0> 51d provided for each bit of an input data, a DBI calculator A 52a, a DBI calculator B 52b, a DBI calculator C 52c and a DBI calculator D 52d. For example, a DBI calculation cycle (tDBI) in the DBI calculators A, B, C and D 52a, 52b, 52c and 52d may be longer than two clock cycles (2tCK) (e.g., between two and three clock cycles) of a read clock signal READ.

The plurality of DBI FIFO A circuits <7:0> 51a, the plurality of DBI FIFO B circuits <7:0> 51b, the plurality of DBI FIFO C circuits <7:0> 51c and the plurality of DBI FIFO B circuits <7:0> 51d may receive corresponding bits of data (e.g., in order of D0, D1, D2, D3, D4, D5, D6, D7, D8, D9, Da, Db, Dc, Dd, De, Df) from RW-bus [7:0] respectively at every read clock cycle (1tCK) of the read clock signal READ. Pointer signals PointerA, PointerB, PointerC and PointerD are periodic signals that may have a periodic cycle of four clock cycles (=4tCK) of a read clock signal READ. The pointer signals PointerA, PointerB, PointerC and PointerD may also have a pulse width of one clock cycle (=1tCK) of the read clock signal READ as an active state (e.g., at a logic high level) for every four clock cycles (4tCK). The pointer signals PointerA, PointerB, PointerC and PointerD may be in the active state in order. For example, a falling edge of the pointer signal PointerA and a rising edge of the pointer signal PointerB occur substantially simultaneously. Similarly, a falling edge of the pointer signal PointerB and a rising edge of the pointer signal PointerC occur substantially simultaneously, a falling edge of the pointer signal PointerC and a rising edge of the pointer signal PointerD occur substantially simultaneously, and a falling edge of the pointer signal PointerD and a rising edge of the pointer signal PointerA occur substantially simultaneously. Each of the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d may receive a combination of pointer signals, one pointer signal that corresponds to the current data, and the other pointer having an active state immediately before the one pointer, which corresponds to the previous data processed by one of the other DBI FIFO circuits. For example, the plurality of DBI FIFO A circuits <7:0> 51a may receive the pointer signals PointerD and PointerA, the plurality of DBI FIFO B circuits <7:0> 51b may receive the pointer signals PointerA and PointerB, the plurality of DBI FIFO C circuits <7:0> 51c may receive the pointer signals PointerB and PointerC, and the plurality of DBI FIFO D circuits <7:0> 51d may receive the pointer signals PointerC and PointerD, respectively. The DBI calculators A, B, C and D 52a, 52b, 52c and 52d may perform DBI calculation to detect whether the majority bits of the current data are different in logic level from the previous data. The DBI calculators B, C and D 52b, 52c and 52d may include similar components in a similar structural configuration as the DBI calculator A 52a and detailed illustrations of the DBI calculators B, C and D 52b, 52c and 52d are omitted in FIG. 5A.

Each DBI FIFO A circuit 51a of the plurality of DBI FIFO A circuits <7:0> 51a includes a flip-flop circuit 511a, a bit inverter 512a and a NAND circuit 514a. Each DBI FIFO B circuit 51b of the plurality of DBI FIFO B circuits <7:0> 51b includes a flip-flop circuit 51b, a bit inverter 512b and a NAND circuit 514b. Each DBI FIFO C circuit 51c of the plurality of DBI FIFO C circuits <7:0> 51c includes a flip-flop circuit 511c, a bit inverter 512c and a NAND circuit 514c. Each DBI FIFO D circuit 51d of the plurality of DBI FIFO D circuits <7:0> 51d includes a flip-flop circuit 511d, a bit inverter 512d and a NAND circuit 514d.

For example, the flip-flop circuits 511a of the DBI FIFO A circuits <7:0> 51a may latch corresponding bits of the data on the corresponding RW-bus[7:0] at 4×N cycles (e.g., D0, D4, D8 and Dc in FIG. 5B), where N is a natural number, responsive to the pointer signal PointerA in the active state (e.g., at a logic high level), and provide latched data signals DBIA[7:0] as shown in FIG. 5B. The bit inverter 512a of each DBI FIFO A circuit 51a may receive a corresponding bit of the latched data signals DBIA[7:0] and a current DBI calculation result signal DBIresA from a comparator circuit 55a coupled to the DBI calculator A 52a. If the current DBI calculation result signal DBIresA is active, the bit inverter 512a may provide an inverted bit of the corresponded bit of the latched data signals DBIA[7:0]. If the current DBI calculation result signal DBIresA is inactive (e.g., at a logic low level), the bit inverter 512a may provide the corresponding bit of the latched data signals DBIA[7:0]. The NAND circuit 514a may receive either the corresponding bit or its inverted bit of the latched data signals DBIA[7:0] from the bit inverter 512a. The NAND circuit 514a may further receive the pointer signal PointerD which has a falling edge (e.g., an end of the active state) coincides as a rising edge (a start of the active state) of the pointer signal PointerA. By using the pointer signal PointerD, a similar effect as providing a pointer signal having a delay of a DBI calculation cycle (tDBI) in FIG. 2A may be obtained, when the DBI calculation cycle (tDBI), which is longer than the two read clock cycles (>2tCK) and shorter than three read clock cycles (<3tCK). Thus, the NAND circuit 514a may provide a logic NAND value of either the corresponding bit or its inverted bit of the latched data signals DBIA[7:0] and the pointer signal PointerD. Thus, the DBI FIFO A circuits <7:0> 51a may receive data on RW-bus[7:0] every four cycles (4tCK) responsive to the pointer signal PointerA and may further update output signals every four cycles (4tCK) responsive to the pointer signal PointerD. Similarly, the DBI FIFO B circuits <7:0> 51b may receive data on RW-bus[7:0] every four cycles (4tCK) responsive to the pointer signal PointerB and may further update output signals every four cycles (4tCK) responsive to the pointer signal PointerA, the DBI FIFO C circuits <7:0> 51c may receive data on RW-bus[7:0] every four cycles (4tCK) responsive to the pointer signal PointerC and may further update output signals every four cycles (4tCK) responsive to the pointer signal PointerB, and the DBI FIFO D circuits <7:0> 51d may receive data on RW-bus[7:0] every four cycles (4tCK) responsive to the pointer signal PointerD and may further update output signals every four cycles (4tCK) responsive to the pointer signal PointerC. A plurality of output circuits 53 may receive output signals of the corresponding DBI FIFO AtoD circuits of the plurality of the DBI FIFO A circuits <7:0> 51a, the plurality of the DBI FIFO B circuits <7:0> 51b, the plurality of the DBI FIFO C circuits <7:0> 51c, the plurality of the DBI FIFO D circuits <7:0> 51d, and provide data output signals Dout [7:0].

Description of components corresponding to components included in the DBI calculator A 52a, the DBI calculator B 52b, the DBI calculator C 52c and the DBI calculator D 52d is substantially the same as the DBI calculators A and B in FIG. 2A and will not be repeated and changes from FIG. 2A, including configuration of latched data signals DBIA, DBIB, DBIC, DBID and pointer signals PointerA, PointerB, PointerC and PointerD will be described. For example, the DBI calculator circuit 3 of FIG. 3 may be used as the DBI calculator A 52a, the DBI calculator B 52b, the DBI calculator C 52c and the DBI calculator D 52d.

The DBI calculator A 52a may receive the latched data signals DBIA[7:0] and DBID[7:0] from the flip-flop circuits 511a of the DBI FIFO A circuits <7:0> 51a and the flip-flop circuits 511d of the DBI FIFO D circuits <7:0> 51d, respectively. Similarly, the DBI calculator B 52b may receive the latched data signals DBIB[7:0] and DBIA[7:0] from the flip-flop circuits 511b of the DBI FIFO B circuits <7:0> 51b and the flip-flop circuits 511a of the DBI FIFO A circuits <7:0> 51a, respectively, the DBI calculator C 52c may receive the latched data signals DBIC[7:0] and DBIB [7:0] from the flip-flop circuits 511c of the DBI FIFO C circuits <7:0> 51c and the flip-flop circuits 511b of the DBI FIFO B circuits <7:0> 51b, respectively, the DBI calculator D 52d may receive the latched data signals DBID[7:0] and DBIC[7:0] from the flip-flop circuits 511d of the DBI FIFO D circuits <7:0> 51d and the flip-flop circuits 511c of the DBI FIFO C circuits <7:0> 51c, respectively.

A comparator circuit 55a may receive the DBI calculation signal DBI_calc_A and a previous DBI calculation result signal DBIrespreD from a flip-flop circuit 56d based on DBI calculation of the DBI calculator D 52d. If the DBI calculation signal DBI_calc_A and the previous DBI calculation result signal DBIrespreD are different, the comparator circuit 55a may provide the current DBI calculation result signal DBIresA in an active state (e.g., "1" or a logic high level). If the DBI calculation signal DBI_calc_A and the previous DBI calculation result signal DBIrespreD are the same, the comparator circuit 55a may provide the current DBI calculation result signal DBIresA in an inactive state (e.g., "0" or a logic low level). A flip-flop circuit 56a may receive the current DBI calculation result signal DBIresA and latch the current DBI calculation result signal DBIresA with the pointer signal PointerD and may provide the latched current DBI calculation result signal DBIresA as a previous DBI calculation result signal DBIrespreA. Similarly, the comparator circuit 55b may receive the DBI calculation signal DBI_calc_B and a previous DBI calculation result signal DBIrespreA from the flip-flop circuit 56a based on DBI calculation of the DBI calculator A 52a, and provide the current DBI calculation result signal DBIresB either in the active state or in the inactive state, the comparator circuit 55c may receive the DBI calculation signal DBI_calc_C and a previous DBI calculation result signal DBIrespreB from a flip-flop circuit 56b based on DBI calculation of the DBI calculator B 52b, and provide the current DBI calculation result signal DBIresC either in the active state or in the inactive state, and the comparator circuit 55d may receive the DBI calculation signal DBI_calc_D and a previous DBI calculation result signal DBIrespreC from a flip-flop circuit 56c based on DBI calculation of the DBI calculator C 52c, and provide the current DBI calculation result signal DBIresD either in the active state or in the inactive state. The DBI circuit 5 may also include a DBI output circuit 57. The DBI output circuit may receive the current DBI calculation result signals DBIresA, DBIresB, DBIresC and DBIresD, and the pointer signals PointerA, PointerB, PointerC and PointerD. The DBI output circuit 57 may provide the current DBI calculation result signal DBIresA as a DBI bit signal responsive to the pointer signal PointerA (or the pointer signal PointerD as a delayed pointer signal), may provide DBIresB as the DBI bit signal responsive to the pointer signal PointerB (or the pointer signal PointerA as a delayed pointer signal), may provide DBIresC as the DBI bit signal responsive to the pointer signal PointerC (or the pointer signal PointerB as a delayed pointer signal), and may provide DBIresD as the DBI bit signal responsive to the pointer signal PointerD (or the pointer signal PointerC as a delayed pointer signal). Because the pointer signals PointerA, PointerB, PointerC, and PointerD are periodic signal having the same cycle and activated alternatingly in order, either DBIresA, DBIresB, DBIresC or DBIresD may be provided as the DBI bit signal, respectively.

Figure 6A:
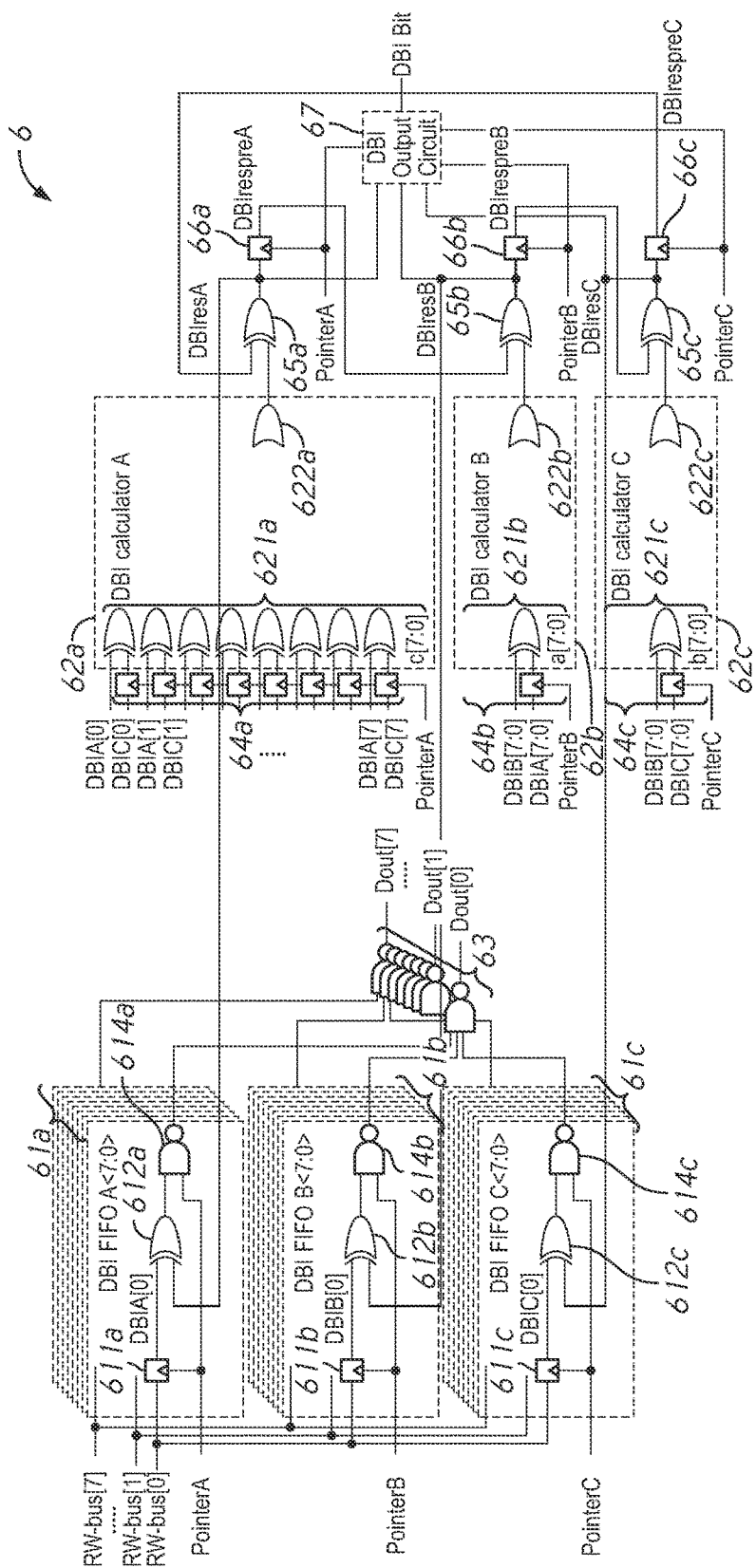
FIG. 6A is a schematic diagram of a DBI circuit in accordance with an embodiment of the present disclosure.
Figure 6B:
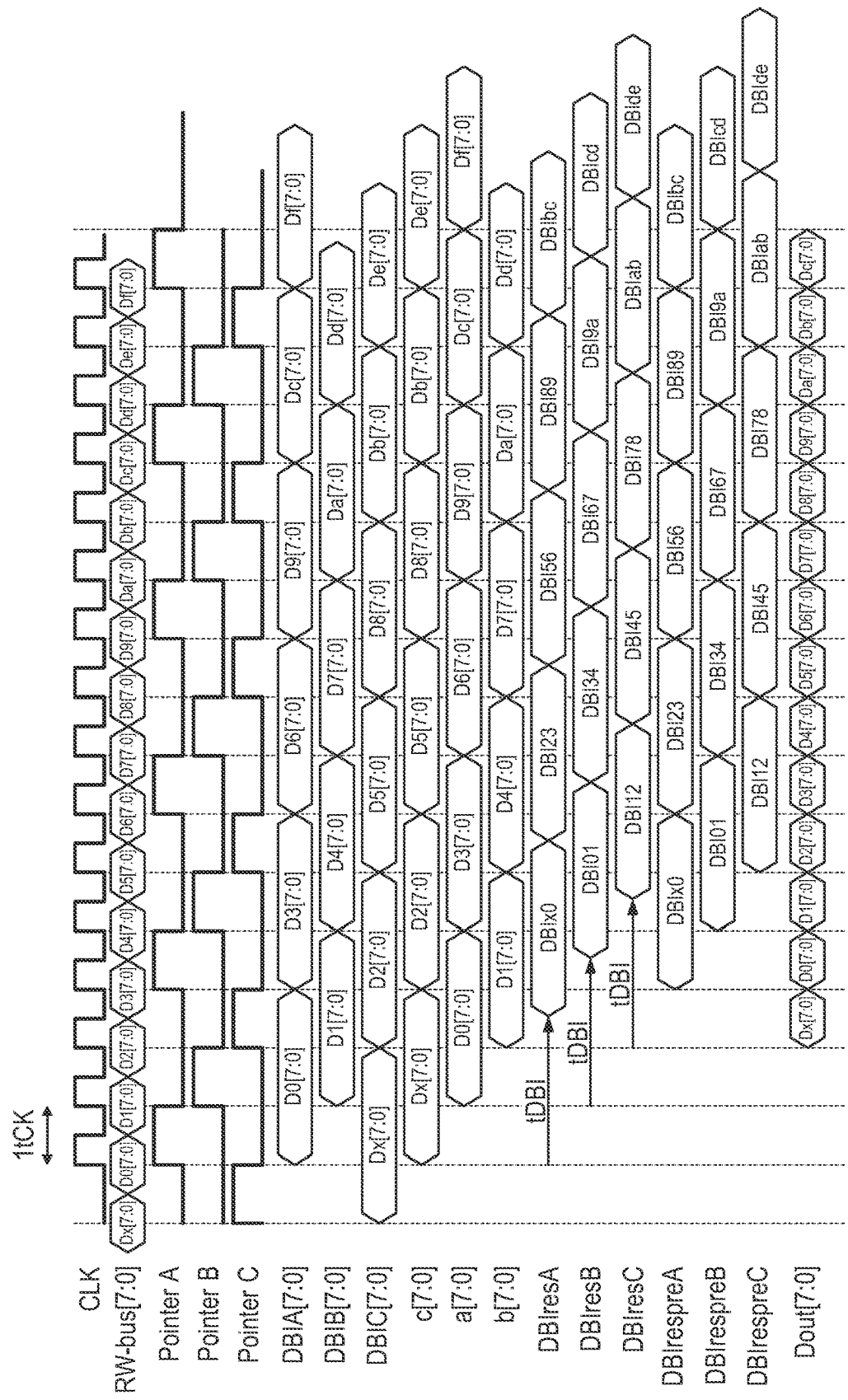
FIG. 6B is a timing diagram of signals in the DBI circuit during a DBI operation in accordance with an embodiment of the present disclosure.

FIG. 6A is a schematic diagram of a DBI circuit 6 in accordance with an embodiment of the present disclosure. FIG. 6B is a timing diagram of signals in the DBI circuit 6 during a DBI operation in accordance with an embodiment of the present disclosure. The DBI circuit 6 may include a plurality of DBI FIFO A circuits <7:0> 61a, a plurality of DBI FIFO B circuits <7:0> 61b and a plurality of DBI FIFO C circuits <7:0> 61c provided for each bit of an input data, a DBI calculator A 52a, a DBI calculator B 52b and a DBI calculator C 52c. For example, a DBI calculation cycle (tDBI) in the DBI calculators A, B and C 62a, 62b and 62c may be longer than two clock cycles (2tCK) (e.g., between two and three clock cycles) of a read clock signal READ.

Description of components corresponding to components included in the plurality of DBI FIFO A circuits <7:0> 61a, the plurality of DBI FIFO B circuits <7:0> 61b and the plurality of DBI FIFO C circuits <7:0> 61c is substantially the same as the plurality of DBI FIFO A circuits <7:0> 51a, the plurality of DBI FIFO B circuits <7:0> 51b and the plurality of DBI FIFO C circuits <7:0> 51c and will not be repeated and changes from FIG. 5A, including configuration of pointer signals PointerA, PointerB and PointerC received by the plurality of DBI FIFO A circuits <7:0> 51a, the plurality of DBI FIFO B circuits <7:0> 51b and the plurality of DBI FIFO C circuits <7:0> 51c will be described.

Pointer signals PointerA, PointerB and PointerC are periodic signals that may have a periodic cycle of three clock cycles (=3tCK) of a read clock signal READ. The pointer signals PointerA, PointerB and PointerC may also have a pulse width of one clock cycle (=1tCK) of the read clock signal READ as an active state (e.g., at a logic high level) for every three clock cycles (3tCK). The pointer signals PointerA, PointerB, and PointerC may be in the active state in order. For example, a falling edge of the pointer signal PointerA and a rising edge of the pointer signal PointerB occur substantially simultaneously. Similarly, a falling edge of the pointer signal PointerB and a rising edge of the pointer signal PointerC occur substantially simultaneously, and a falling edge of the pointer signal PointerC and a rising edge of the pointer signal PointerA occur substantially simultaneously. Each of the plurality of DBI FIFO A circuits <7:0> 61a, the plurality of DBI FIFO B circuits <7:0> 61b and the plurality of DBI FIFO C circuits <7:0> 61c may receive a corresponding pointer signal, PointerA, PointerB, PointerC, respectively.

For example, the flip-flop circuits 611a of the DBI FIFO A circuits <7:0> 61a may latch corresponding bits of the data on the corresponding RW-bus[7:0] at 3×N cycles (e.g., D0, D3, D6, D9, Dc and Df in FIG. 6B), where N is a natural number, responsive to the pointer signal PointerA in the active state (e.g., at a logic high level), and provide latched data signals DBIA[7:0] as shown in FIG. 6B. The bit inverter 612a of each DBI FIFO A circuit 61a may receive a corresponding bit of the latched data signals DBIA[7:0] and a current DBI calculation result signal DBIresA from a comparator circuit 65a coupled to the DBI calculator A 62a. If the current DBI calculation result signal DBIresA is active, the bit inverter 612a may provide an inverted bit of the corresponded bit of the latched data signals DBIA[7:0]. If the current DBI calculation result signal DBIresA is inactive (e.g., at a logic low level), the bit inverter 612a may provide the corresponding bit of the latched data signals DBIA[7:0]. The NAND circuit 614a may receive either the corresponding bit or its inverted bit of the latched data signals DBIA[7:0] from the bit inverter 612a. The NAND circuit 614a may further receive the pointer signal PointerA. Thus, the NAND circuit 614a may provide a logic NAND value of either the corresponding bit or its inverted bit of the latched data signals DBIA[7:0] and the pointer signal PointerA. Thus, the DBI FIFO A circuits <7:0> 61a may receive data on RW-bus[7:0] every three cycles (3tCK) and may further update output signals every four cycles (3tCK) responsive to the pointer signal PointerA. Similarly, the DBI FIFO B circuits <7:0> 61b and the DBI FIFO C circuits 61c may receive data on RW-bus[7:0] every three cycles (3tCK) responsive to the pointer signals PointerB and PointerC respectively, and may further update output signals every three cycles (3tCK) responsive to the pointer signals PointerB and PointerC, respectively. A plurality of output circuits 63 may receive output signals of the corresponding DBI FIFO A to C circuits of the plurality of the DBI FIFO A circuits <7:0> 61a, the plurality of the DBI FIFO B circuits <7:0> 61b, the plurality of the DBI FIFO C circuits <7:0> 61c, and provide data output signals Dout [7:0].

The DBI calculators A, B and C 62a, 62b and 62c may perform DBI calculation to detect whether the majority bits of the current data are different in logic level from the previous data. The DBI calculators A, B and C 62a, 62b and 62c may include similar components in a similar structural configuration as the DBI calculator A 62a in FIG. 6A, and detailed illustrations of the DBI calculators B and C 62b and 62c are omitted in FIG. 6A. Description of components corresponding to components included in the DBI calculator A 62a, the DBI calculator B 62b and the DBI calculator C 62c is substantially the same as the DBI calculators A and B in FIG. 2A and will not be repeated and changes from FIG. 2A, including configuration of latched data signals DBIA, DBIB, DBIC and pointer signals PointerA, PointerB, PointerC will be described. For example, the DBI calculator circuit 3 of FIG. 3 may be used as the DBI calculator A 62a, the DBI calculator B 62b and the DBI calculator C 62c. The DBI calculator A 62a may receive the latched data signals DBIA[7:0] from the flip-flop circuits 611a of the DBI FIFO A circuits <7:0> 61a. The DBI calculator A 62a may also receive data signals c[7:0] from a plurality of flip-flop circuits 64a. The plurality of flip-flop circuits 64a may receive the latched data signals DBIC[7:0] from the flip-flop circuits 611c of the DBI FIFO C circuits <7:0> 61c and the pointer signal PointerA, and latch the latched data signals DBIC[7:0] respectively to provide the data signals c[7:0]. Similarly, the DBI calculator B 62b may also receive data signals a[7:0] that is the latched data signals DBIA[7:0] further latched by a plurality of flip-flop circuits 64b using the pointer signal PointerB. The DBI calculator C 62c may also receive data signals b[7:0] that is the latched data signals DBIB[7:0] further latched by a plurality of flip-flop circuits 64c using the pointer signal PointerC.

Figure 7A:
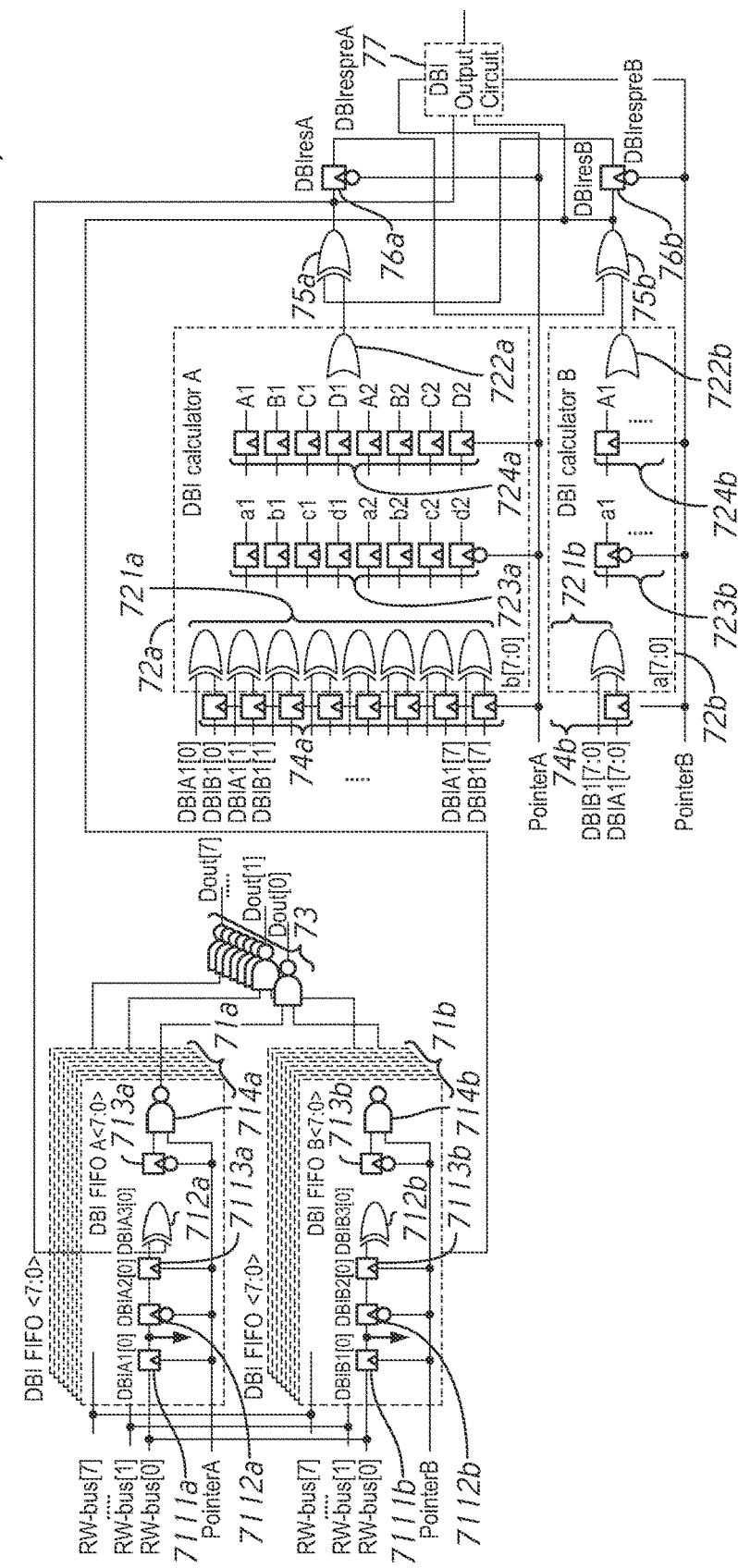
FIG. 7A is a schematic diagram of a DBI circuit in accordance with an embodiment of the present disclosure.
Figure 7B:
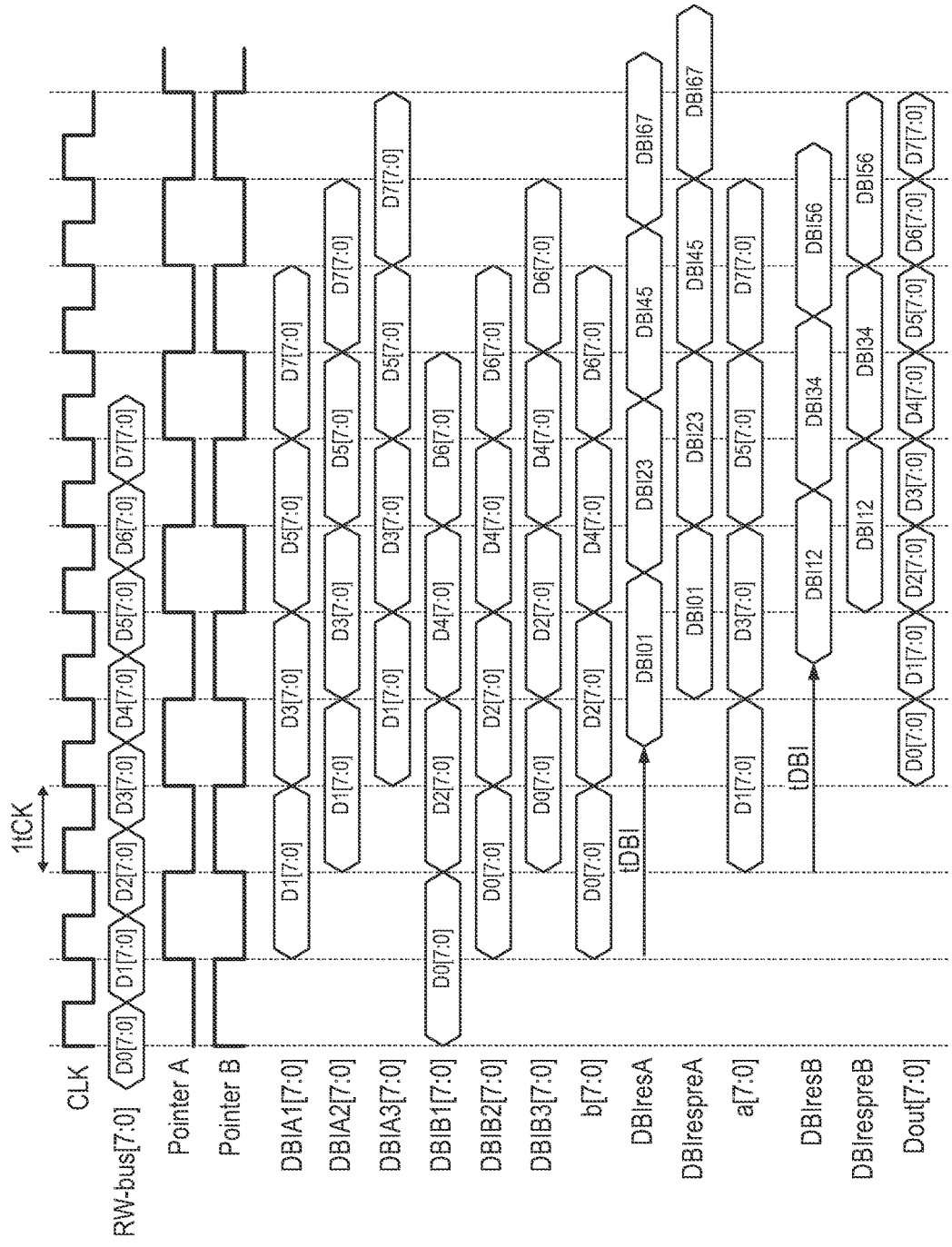
FIG. 7B is a timing diagram of signals in the DBI circuit during a DBI operation in accordance with an embodiment of the present disclosure.

FIG. 7A is a schematic diagram of a DBI circuit 7 in accordance with an embodiment of the present disclosure. FIG. 7B is a timing diagram of signals in the DBI circuit 7 during a DBI operation in accordance with an embodiment of the present disclosure. The DBI circuit 7 may include a plurality of DBI FIFO A circuits <7:0> 71a and a plurality of DBI FIFO B circuits <7:0> 71b provided for each bit of an input data, a DBI calculator A 72a and a DBI calculator B 72b. For example, a DBI calculation cycle (tDBI) in the DBI calculators A and B 72a and 72b may be longer than two clock cycles (2tCK) of a read clock signal READ. The plurality of DBI FIFO A circuits <7:0> 71a and the plurality of DBI FIFO B circuits <7:0> 71b both may receive a plurality of corresponding bits of data (e.g., in order of D0, D1, D2, D3, D4, D5, D6, D7) from RW-bus [7:0] respectively at every read clock cycle (1tCK) of the read clock signal READ. The plurality of DBI FIFO A circuits <7:0> 71a and the plurality of DBI FIFO B circuits <7:0> 71b may receive pointer signals PointerA and PointerB respectively. The PointerA signal and the PointerB signal are periodic signals that may have a pulse width of one clock cycle (=1tCK) of the read clock signal READ, and they are complementary to each other. Thus, PointerA signal and the PointerB signal may alternate their active states (e.g., a logic high level) and data may be latched at every other cycles (e.g., odd cycles only, or even cycles only) by the pointer signals PointerA and PointerB. The DBI calculator A 72a and the DBI calculator B 72b may perform DBI calculation to detect whether the majority bits of the current data are different in logic level from the previous data. The DBI calculator B 72b may include similar components in a similar structural configuration as the DBI calculator A 72a, and detailed illustration of the DBI calculator B 72b is omitted in FIG. 7A.

Each DBI FIFO A circuit 71a of the plurality of DBI FIFO A circuits <7:0> 71a may include a series of flip-flop circuits 7111a, 7112a, 7113a, a bit inverter 712a, a flip-flop circuit 713a, and a NAND circuit 714a. Each DBI FIFO B circuit of the plurality of DBI FIFO B circuits <7:0> 21b includes a series of flip-flop circuits 7111b, 7112b, 7113b, a bit inverter 712*b*, a flip-flop circuit 713*b*, and a NAND circuit 714*b*. The plurality of DBI FIFO A circuits <7:0> 71*a* and the plurality of DBI FIFO B circuits <7:0> 71*b* may provide FIFO output signals to a plurality of output circuits 73, in synchronous to DBI bit signals by holding for a number of clock cycles of the read clock signal READ corresponding to DBI calculation time (tDBI).

For example, the flip-flop circuits 7111*b* of the DBI FIFO B circuits <7:0> 71*b* may latch corresponding bits of the data on the corresponding RW-bus[7:0] at even cycles (e.g., D0, D2, D4, D6 in FIG. 2B) responsive to the PointerB signal in the beginning of its active state (e.g., at a rising edge to a logic high level), and provide latched data signals DBIB1[7:0]. The flip-flop circuits 7112*b* of the DBI FIFO B circuits <7:0> 71*b* may latch corresponding bits of the data on the corresponding DBIB1[7:0] at even cycles (e.g., D0, D2, D4, D6 in FIG. 2B) responsive to the PointerB signal in the end of the active state (e.g., at a falling edge to a logic low level), and provide latched data signals DBIB2[7:0]. The flip-flop circuits 7113*b* of the DBI FIFO B circuits <7:0> 71*b* may latch corresponding bits of the data on the corresponding DBIB2[7:0] at even cycles (e.g., D0, D2, D4, D6 in FIG. 2B) responsive to the PointerB signal in the beginning of the active state, and provide latched data signals DBIB3[7:0]. The bit inverter 712*b* of each DBI FIFO B circuit 71*b* may receive a corresponding bit of the latched data signals DBIB3[7:0] and a current DBI calculation result signal DBIresB from a comparator circuit 75*b* coupled to the DBI calculator B 72*b*. If the current DBI calculation result signal DBIresB is active, the bit inverter 712*b* may provide an inverted bit of the corresponded bit of the latched data signals DBIB3[7:0]. If the current DBI calculation result signal DBIresB is inactive (e.g., at a logic low level), the bit inverter 712*b* may provide the corresponded bit of the latched data signals DBIB3[7:0]. The flip-flop circuit 713*b* of each DBI FIFO B circuit 71*b* may latch an output signal of the bit inverter 712*b* responsive to the pointer signal PointerB in the end of the active state. The NAND circuit 714*b* of each DBI FIFO B circuit 71*b* may provide an inverted signal of the output signal of the bit inverter 712*b* as a FIFO output signal if the pointer signal PointerB is in the active state. Similarly, the DBI FIFO A circuits <7:0> 21*a* may latch corresponding bits of the data on the corresponding RW-bus[7:0] at odd cycles (e.g., D1, D3, D5, D7 in FIG. 2B) responsive to the PointerA signal in the beginning of the active state, and provide a FIFO output signal if the pointer signal PointerA is in the active state. A plurality of output circuits 73 may receive the FIFO output signals of the corresponding NAND circuits 714*a* and 714*b* and provide data output signals Dout [7:0].

The DBI calculator A 72*a* may receive the latched data signals DBIA1[7:0] from the flip-flop circuits 7111*a* of the DBI FIFO A circuits <7:0> 71*a*. The DBI calculator A 22*a* may also receive data signals b[7:0] from a plurality of flip-flop circuits 74*a*. The plurality of flip-flop circuits 74*a* may receive the latched data signals DBIB1[7:0] from the flip-flop circuits 7111*b* of the DBI FIFO B circuits <7:0> 71*b* and the pointer signal PointerA, and latch the latched data signals DBIB1[7:0] respectively to provide the data signals b[7:0]. The DBI calculator A 72*a* may include an input stage similar to the input state 31 in FIG. 3, that may include a plurality of comparator circuits 721*a* and a plurality of flip-flop circuits 723*a*. For example, the plurality of comparator circuits 721*a* may be XOR circuits. Each comparator circuit of the plurality of comparator circuits 721*a* may receive a corresponding bit of the data signals b[7:0] and a corresponding bit of the latched data signals DBIA1 [7:0] and provide a result signal for each corresponding bit. For example, the result signal may be an active state (e.g., "1" or a logic high level), if the corresponding bit of the data signals b[7:0] and the corresponding bit of the latched data signals DBIA1[7:0] are different, which indicates that the corresponding bits of the previous data and the current data are different. Similarly, the result signal may be an inactive state (e.g., "0" or a logic low level), if the corresponding bit of the data signals b[7:0] and the corresponding bit of the latched data signals DBIA1[7:0] are the same, which indicates that the corresponding bits of the previous data and the current data are the same. The plurality of flip-flop circuits 723*a* may latch signals to be provided as a1, b1, c1, d1, a2, b2, c2 and d2 using an inverted signal of the pointer signal PointerA, thus the signals are latched responsive to the falling edge of PointerA. The DBI calculator A 72*a* may further include an intermediate stage similar to the intermediate state 32 in FIG. 3, that may include a plurality of flip-flop circuits 724*a*. The plurality of flip-flop circuits 724*a* may latch signals to be provided as A1, B1, C1, D1, A2, B2, C2 and D2 using the pointer signal PointerA, thus the signals are latched responsive to the rising edge of PointerA. The DBI calculator A 72*a* may include an adder circuit 722*a*. For example, the adder circuit 722*a* may be an OR circuit. The adder circuit 722*a* may receive calculation signals after calculations based on the result signals from the plurality of comparator circuits 721*a* and may provide a DBI calculation signal DBI_calc_A. Calculations based on the result signals was similar to the calculation with reference to FIG. 3, adding latching steps by the plurality of flip-flop circuits 723*a* and 724*a*. The comparator circuit 75*a* may receive the DBI calculation signal DBI_calc_A and a previous DBI calculation result signal DBIrespreB from a flip-flop circuit 76*b* based on DBI calculation of the DBI calculator B 72*b*. If the DBI calculation signal DBI_calc_A and the previous DBI calculation result signal DBIrespreB are different, the comparator circuit 75*a* may provide the current DBI calculation result signal DBIresA in an active state (e.g., "1" or a logic high level). If the DBI calculation signal DBI_calc_A and the previous DBI calculation result signal DBIrespreB are the same, the comparator circuit 75*a* may provide the current DBI calculation result signal DBIresA in an inactive state (e.g., "0" or a logic low level). A flip-flop circuit 76*a* may receive the current DBI calculation result signal DBIresA and latch the current DBI calculation result signal DBIresA with the inverted signal of the pointer signal PointerA and may provide the latched current DBI calculation result signal DBIresA as a previous DBI calculation result signal DBIrespreA. Similarly, the DBI calculator B 72*b* together with a comparator circuit 75*b* and a flip-flop circuit 76*b* may provide the current DBI calculation result signal DBIresB and the previous DBI calculation result signal DBIrespreB. The DBI circuit 7 may also include a DBI output circuit 77. The DBI output circuit 77 may receive the current DBI calculation result signals DBIresA and DBIresB and the pointer signals PointerA and PointerB. The DBI output circuit 77 may provide DBIresA as a DBI bit signal responsive to the pointer signal PointerA and may provide DBIresB as the DBI bit signal responsive to the pointer signal PointerB. Because the pointer signals PointerA and PointerB are complementary periodic signals, either DBIresA or DBIresB may be provided as the DBI bit signal at odd cycles or even cycles, respectively.

Figure 8A:
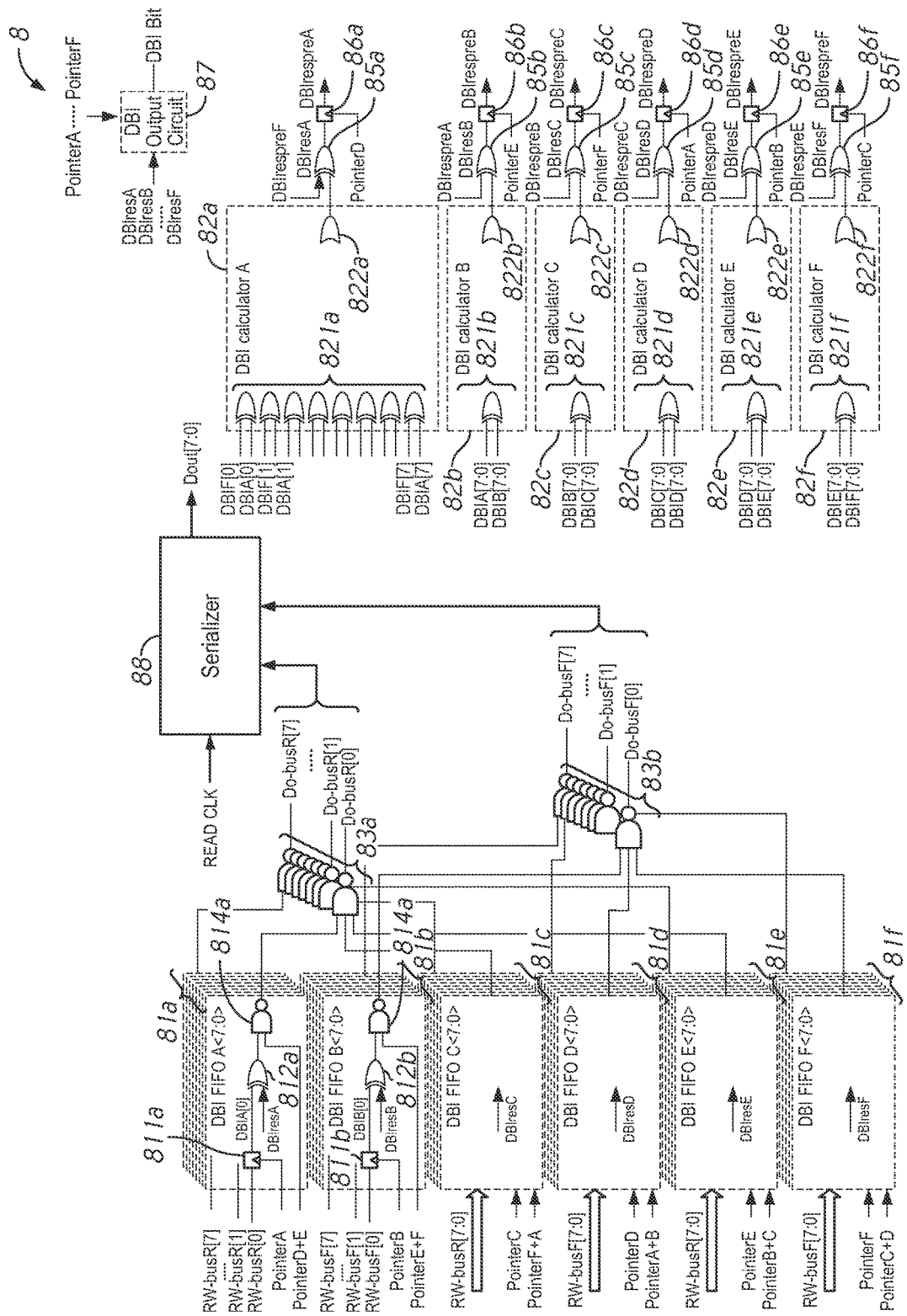
FIG. 8A is a schematic diagram of a DBI circuit in accordance with an embodiment of the present disclosure.
Figure 8B:
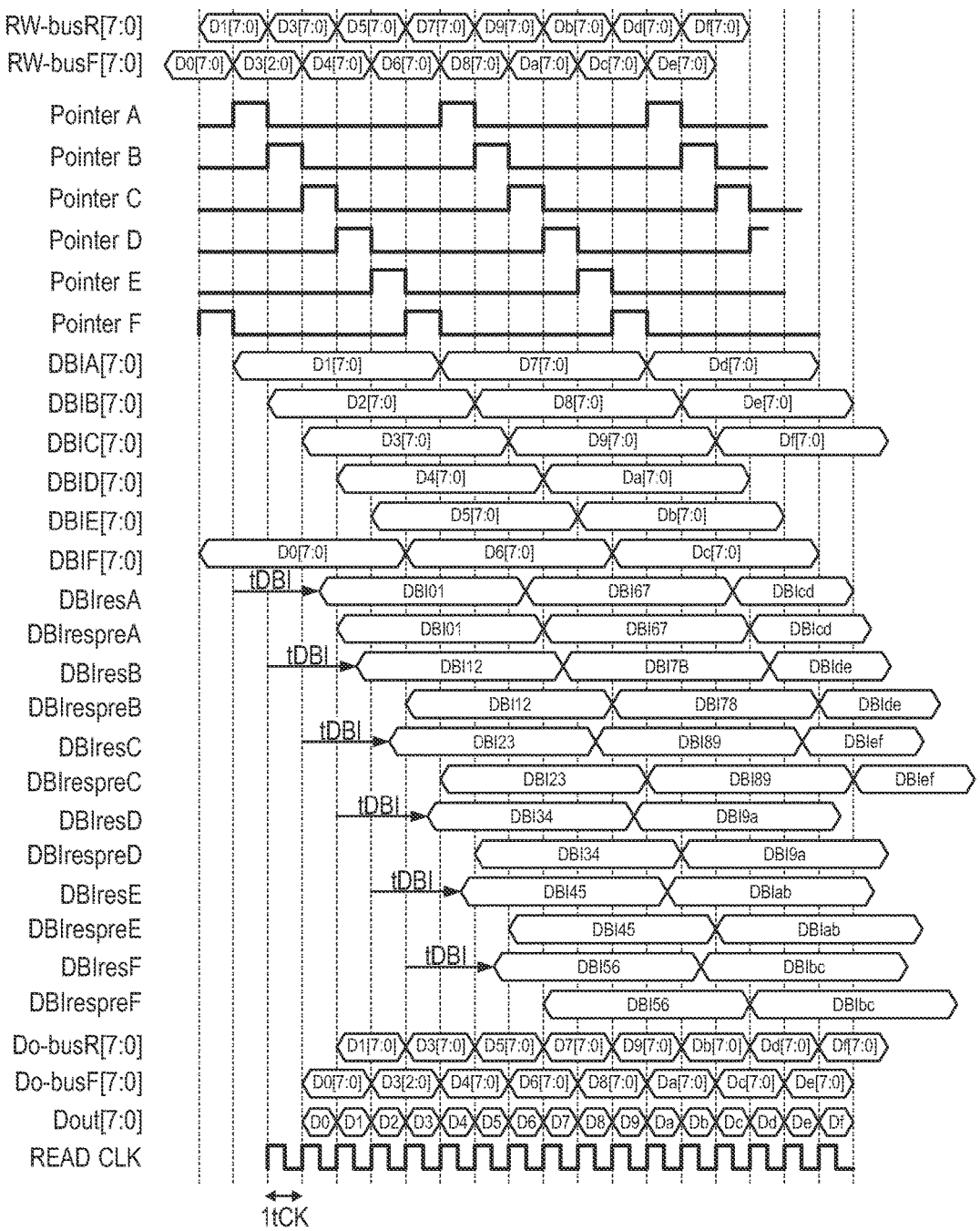
FIG. 8B is a timing diagram of signals in the DBI circuit during a DBI operation in accordance with an embodiment of the present disclosure.

FIG. 8A is a schematic diagram of a DBI circuit 8 in accordance with an embodiment of the present disclosure. FIG. 8B is a timing diagram of signals in the DBI circuit 8 during a DBI operation in accordance with an embodiment of the present disclosure. Description of components corresponding to components included in FIG. 5A will not be repeated and changes from FIG. 5A, including configuration of RW-bus signals and pointer signals will be described. Similarly to FIGS. 4A and 4B, RW-busR[7:0] and RW-busF [7:0] in FIG. 8B both may transmit data of every other data alternatingly every two clock cycles (2tCK) of a read clock signal READ. For example, RW-busR[7:0] may transmit data of odd cycles (e.g., in order of D1, D3, D5, D7, D9, Db, Dd and Df) to a dataR circuit 80a and RW-busF[7:0] may transmit data of even cycles (e.g., in order of D0, D2, D4, D6, D8, Da, Dc and De) to a dataF circuit 80b. The dataR circuit 80a may include a plurality of DBI FIFO A circuits <7:0> 81a, a plurality of DBI FIFO C circuits <7:0> 81c and a plurality of DBI FIFO E circuits <7:0> 81e that may receive corresponding bits of data (e.g., in order of D1, D3, D5, D7, D9, Db, Dd and Df) from RW-bus_R[7:0] respectively at every other read clock cycle (2tCK) of the read clock signal READ. The dataR circuit 80a may also include a plurality of output circuits 83a. The dataF circuit 80b may include a plurality of DBI FIFO B circuits <7:0> 81b, a plurality of DBI FIFO D circuits <7:0> 81d and a plurality of DBI FIFO E circuits <7:0> 81e that may receive corresponding bits of data (e.g., in order of D0, D2, D4, D6, D8, Da, Dc and De) from RW-bus_F[7:0] respectively at every other read clock cycle (2tCK) of the read clock signal READ. The dataF circuit 80b may also include a plurality of output circuits 83b. The dataR circuit 80a may provide Do_busR[7:0] signals and the dataF circuit 80b may provide Do_busF[7:0] signals. The DBI circuit 8 may further include a serializer circuit 88 that may receive the Do_busR[7:0] signals and Do_busF[7:0] signals. The serializer circuit 88 may combine the Do_busR[7:0] signals and Do_busF[7:0] signals and may provide data output signals Dout [7:0] in series responsive to the read clock signal READ in order of D0, D1, D2, D3, D4, D5, D6, D7, D8, D9, Da, Db, Dc, Dd, De and Df.

For example, the flip-flop circuits 811a of the DBI FIFO A circuits <7:0> 81a may latch corresponding bits of the data on the corresponding RW-busR[7:0] at every six cycles (e.g., D1, D7 and Dd in FIG. 8B), responsive to the pointer signal PointerA in the active state (e.g., at a logic high level), and provide latched data signals DBIA[7:0] as shown in FIG. 8B. The bit inverter 812a of each DBI FIFO A circuit 811a may receive a corresponding bit of the latched data signals DBIA[7:0] and a current DBI calculation result signal DBIresA from a comparator circuit 85a coupled to the DBI calculator A 82a. If the current DBI calculation result signal DBIresA is active, the bit inverter 812a may provide an inverted bit of the corresponded bit of the latched data signals DBIA[7:0]. If the current DBI calculation result signal DBIresA is inactive (e.g., at a logic low level), the bit inverter 812a may provide the corresponding bit of the latched data signals DBIA[7:0]. The NAND circuit 814a may receive either the corresponding bit or its inverted bit of the latched data signals DBIA[7:0] from the bit inverter 812a at one input node. The NAND circuit 814a may further receive the pointer signal PointerD which is delayed by three clock cycles (3tCK) of the read clock signal READ from the pointer signal PointerA ((e.g., having a rising edge as a beginning of the active state three clock cycles (3tCK) after a rising edge of the pointer signal PointerA) and the pointer signal PointerE which is delayed by four clock signal from the pointer signal PointerA at the other input node. By using the pointer signals PointerD and PointerE, a similar effect as providing a pointer signal having a delay of a DBI calculation cycle (tDBI) in FIG. 5A may be obtained, if the DBI calculation cycle (tDBI), which is longer than the two read clock cycles (>2tCK) and shorter than three read clock cycles (<3tCK). Thus, the NAND circuit 514a may provide a logic NAND value of either the corresponding bit or its inverted bit of the latched data signals DBIA[7:0] and the pointer signal PointerD. Thus, the DBI FIFO A circuits <7:0> 81a may receive data on RW-busR[7:0] every six cycles (6tCK) responsive to the pointer signal PointerA and may further update output signals every six cycles (6tCK) responsive to the pointer signals PointerD and PointerE. Similarly, the DBI FIFO B circuits <7:0> 81b may receive data on RW-busF[7:0] every six cycles (6tCK) responsive to the pointer signal PointerB and may further update output signals every six cycles (6tCK) responsive to the pointer signals PointerE and PointerF, the DBI FIFO C circuits <7:0> 81c may receive data on RW-busR[7:0] every six cycles (6tCK) responsive to the pointer signal PointerC and may further update output signals every six cycles (6tCK) responsive to the pointer signals PointerF and PointerA, and the DBI FIFO D circuits <7:0> 81d may receive data on RW-busF[7:0] every six cycles (6tCK) responsive to the pointer signal PointerD and may further update output signals every six cycles (6tCK) responsive to the pointer signals PointerA and PointerB. Similarly, the DBI FIFO E circuits <7:0> 81e and the DBI FIFO F circuits <7:0> may receive data on RW-busR[7:0] and RW-busF[7:0] every six cycles (6tCK) responsive to the pointer signals PointerE and Pointer F, respectively, and may further update output signals every six cycles (6tCK) responsive to a combination of the pointers signals PointerB and PointerC, and a combination of the pointer signals PointerC and PointerD, respectively. The plurality of output circuits 83a may receive output signals of the corresponding DBI FIFO A, C, E circuits of the plurality of the DBI FIFO A circuits <7:0> 81a, the plurality of the DBI FIFO C circuits <7:0> 81c and the plurality of the DBI FIFO E circuits <7:0> 81e, and provide data output signals Do-busR[7:0] to the serializer circuit 88. Similarly, the plurality of output circuits 83b may receive output signals of the corresponding DBI FIFO B, D, F circuits of the plurality of the DBI FIFO B circuits <7:0> 81b, the plurality of the DBI FIFO D circuits <7:0> 81d and the plurality of the DBI FIFO F circuits <7:0> 81f, and provide data output signals Do-busF[7:0] to the serializer circuit 88.

A comparator circuit 85a may receive the DBI calculation signal DBI_calc_A and a previous DBI calculation result signal DBIrespreF from a flip-flop circuit 86f based on DBI calculation of the DBI calculator F 82f. If the DBI calculation signal DBI_calc_A and the previous DBI calculation result signal DBIrespreF are different, the comparator circuit 85a may provide the current DBI calculation result signal DBIresA in an active state (e.g., "1" or a logic high level). If the DBI calculation signal DBI_calc_A and the previous DBI calculation result signal DBIrespreF are the same, the comparator circuit 85a may provide the current DBI calculation result signal DBIresA in an inactive state (e.g., "0" or a logic low level). A flip-flop circuit 86a may receive the current DBI calculation result signal DBIresA and latch the current DBI calculation result signal DBIresA with the pointer signal PointerD and may provide the latched current DBI calculation result signal DBIresA as a previous DBI calculation result signal DBIrespreA. Similarly, the comparator circuit 85b may receive the DBI calculation signal DBI_calc_B and a previous DBI calculation result signal DBIrespreA from a flip-flop circuit 86a based on DBI calculation of the DBI calculator A 82a, and provide the current DBI calculation result signal DBIresB either in the active state or in the inactive state, the comparator circuit 85*c* may receive the DBI calculation signal DBI_calc_C and a previous DBI calculation result signal DBIrespreB from a flip-flop circuit 86*b* based on DBI calculation of the DBI calculator B 82*b*, and provide the current DBI calculation result signal DBIresC either in the active state or in the inactive state, and the comparator circuit 85*d* may receive the DBI calculation signal DBI_calc_D and a previous DBI calculation result signal DBIrespreC from a flip-flop circuit 86*c* based on DBI calculation of the DBI calculator C 82*c*, and provide the current DBI calculation result signal DBIresD either in the active state or in the inactive state. Similarly, the comparator circuits 85*e* and 85*f* may provide the current DBI calculation result signals DBIresE and DBIresF, respectively. The DBI circuit 8 may also include a DBI output circuit 87. The DBI output circuit may receive the current DBI calculation result signals DBIresA, DBIresB, DBIresC, DBIresD, DBIresE and DBIresF and the pointer signals PointerA, PointerB, PointerC, PointerD, PointerE and PointerF. The DBI output circuit 87 may provide the current DBI calculation result signal DBIresA as a DBI bit signal responsive to the pointer signal PointerA (or the pointer signal PointerD as a delayed pointer signal), may provide DBIresB as the DBI bit signal responsive to the pointer signal PointerB (or the pointer signal PointerE as a delayed pointer signal), may provide DBIresC as the DBI bit signal responsive to the pointer signal PointerC (or the pointer signal PointerF as a delayed pointer signal), may provide DBIresD as the DBI bit signal responsive to the pointer signal PointerD (or the pointer signal PointerA as a delayed pointer signal), may provide DBIresE as the DBI bit signal responsive to the pointer signal PointerE (or the pointer signal PointerB as a delayed pointer signal) and may provide DBIresF as the DBI bit signal responsive to the pointer signal PointerF (or the pointer signal PointerC as a delayed pointer signal). Because the pointer signals PointerA, PointerB, PointerC, PointerD, PointerE and Pointer F are periodic signal having the same cycle and activated alternatingly in order, either DBIresA, DBIresB, DBIresC, DBIresD, DBIresE, or DBIresF may be provided as the DBI bit signal, respectively.

Figure 9A:
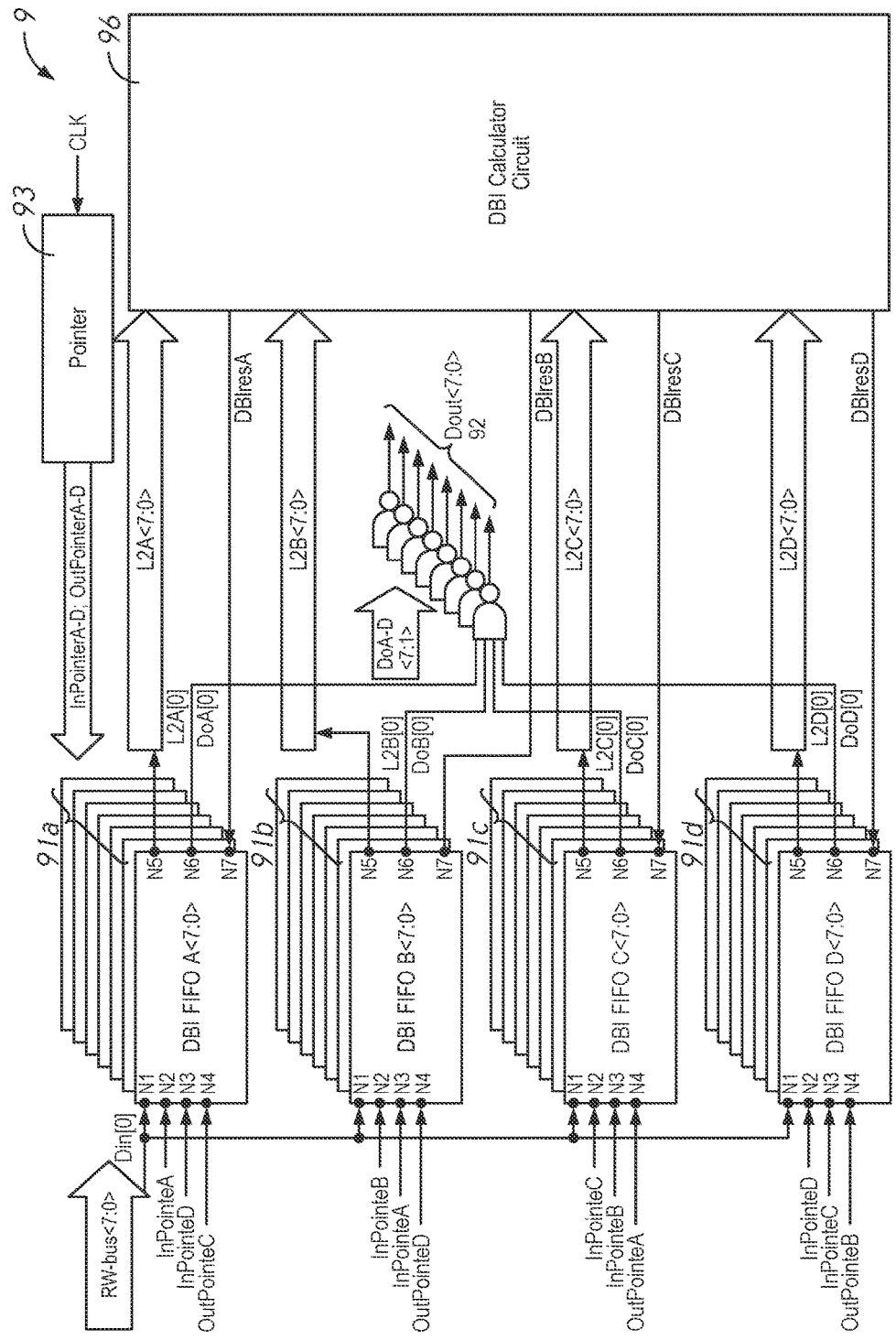
FIG. 9A is a schematic diagram of a DBI circuit in accordance with an embodiment of the present disclosure.

FIG. 9A is a schematic diagram of a DBI circuit 9 in accordance with an embodiment of the present disclosure. The DBI circuit 9 may include a plurality of DBI FIFO A circuits <7:0> 91*a*, a plurality of DBI FIFO B circuits <7:0> 91*b*, a plurality of DBI FIFO C circuits <7:0> 91*c* and a plurality of DBI FIFO D circuits <7:0> 91*d* provided for input data from RW-bus <7:0>. The DBI circuit 9 may also include a DBI calculator circuit 96, a pointer circuit 93 that may receive a read clock signal CLK and an output circuit 92 that may provide output data Dout <7:0>.

Figure 9B:
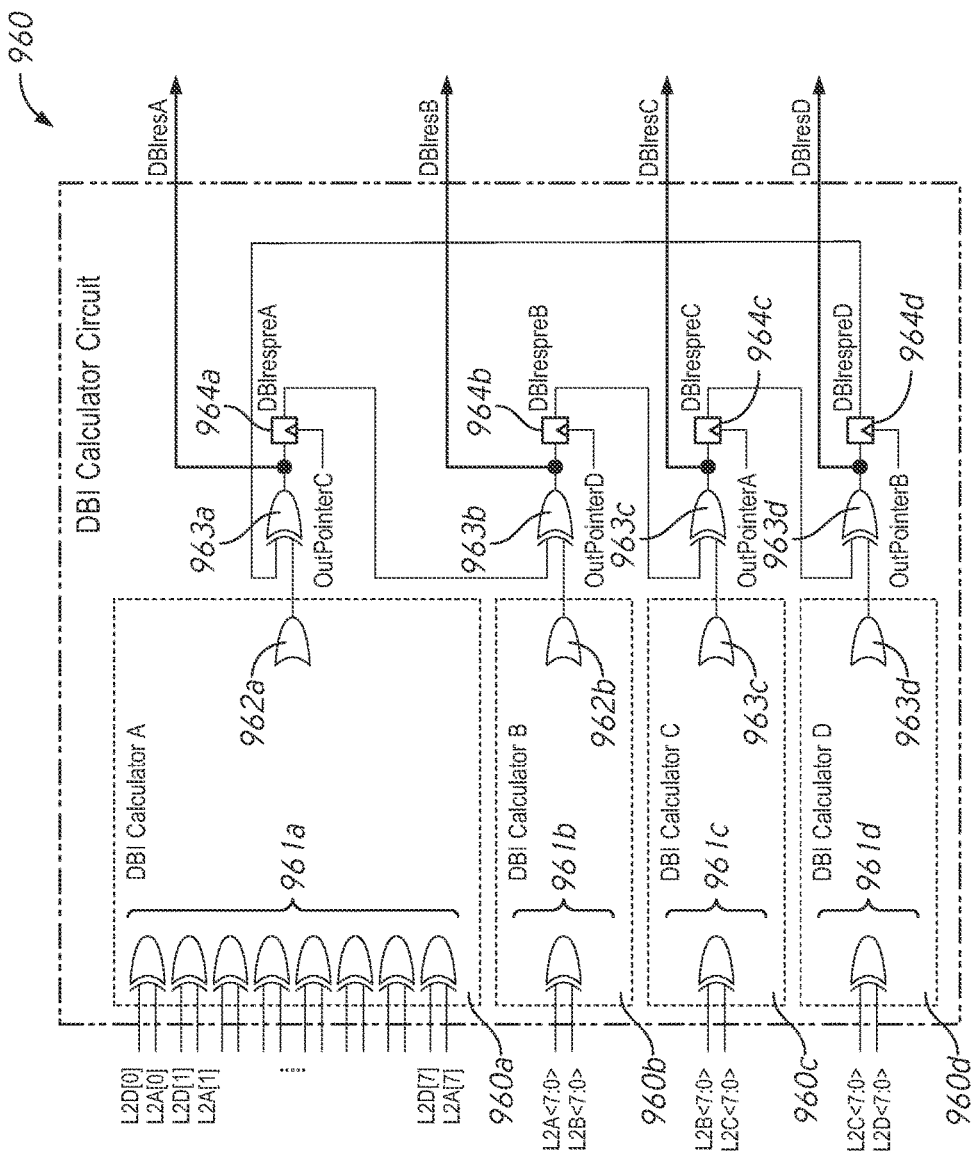
FIG. 9B is a circuit diagram of a DBI calculator circuit in accordance with an embodiment of the present disclosure.

FIG. 9B is a circuit diagram of a DBI calculator circuit 960 in accordance with an embodiment of the present disclosure. For example, the DBI calculator circuit 960 may be the DBI calculator circuit 96 in FIG. 9A. For example, the DBI calculator circuit 960 may include a DBI calculator A 960*a*, a DBI calculator B 960*b*, a DBI calculator C 960*c* and a DBI calculator D 960*d*. For example, a DBI calculation cycle (tDBI) in the DBI calculators A, B, C and D 960*a*, 960*b*, 960*c* and 960*d* may be longer than two clock cycles (2tCK) (e.g., between two and three clock cycles) of the read clock signal CLK. Description of components corresponding to components included in the DBI calculator A 960*a*, the DBI calculator B 960*b*, the DBI calculator C 960*c* and the DBI calculator D 960*d* is substantially the same as the DBI calculators in FIG. 3 or FIG. 5A and thus will not be repeated.

The plurality of DBI FIFO A circuits <7:0> 91*a*, the plurality of DBI FIFO B circuits <7:0> 91*b*, the plurality of DBI FIFO C circuits <7:0> 91*c* and the plurality of DBI FIFO B circuits <7:0> 91*d* may receive common input data from the RW-bus <7:0>. The pointer circuit 93 may provide InPointerA, InPointerB, InPointerC and InPointerD signals responsive to the read clock CLK. The pointer circuit 93 may further provide OutPointerA, OutPointerB, OutPointerC and OutPointerD signals responsive to the read clock CLK. Each of the plurality of DBI FIFO A circuits <7:0> 91*a*, the plurality of DBI FIFO B circuits <7:0> 91*b*, the plurality of DBI FIFO C circuits <7:0> 91*c* and the plurality of DBI FIFO D circuits <7:0> 91*d* may receive a combination of those pointer signals. For example, the plurality of DBI FIFO A circuits <7:0> 91*a* may receive the pointer signals InPointerA, InPointerD and OutPointerC, the plurality of DBI FIFO B circuits <7:0> 91*b* may receive the pointer signals InPointerB, InPointerA and OutPointerD, the plurality of DBI FIFO C circuits <7:0> 91*c* may receive the pointer signals InPointerC, InPointerB and OutPointerA, and the plurality of DBI FIFO D circuits <7:0> 91*d* may receive the pointer signals InPointerD, InPointerC and OutPointerB, respectively. The DBI calculators A, B, C and D 960*a*, 960*b*, 960*c* and 960*d* may perform DBI calculation to detect whether the majority bits of the current data are different in logic level from the previous data. The DBI calculators B. C and D 960*b*, 960*c* and 960*d* may include similar components in a similar structural configuration as the DBI calculator A 960*a* and detailed illustrations of the DBI calculators B, C and D 960*b*, 960*c* and 92*d* are omitted in FIG. 9B.

Figure 9C:
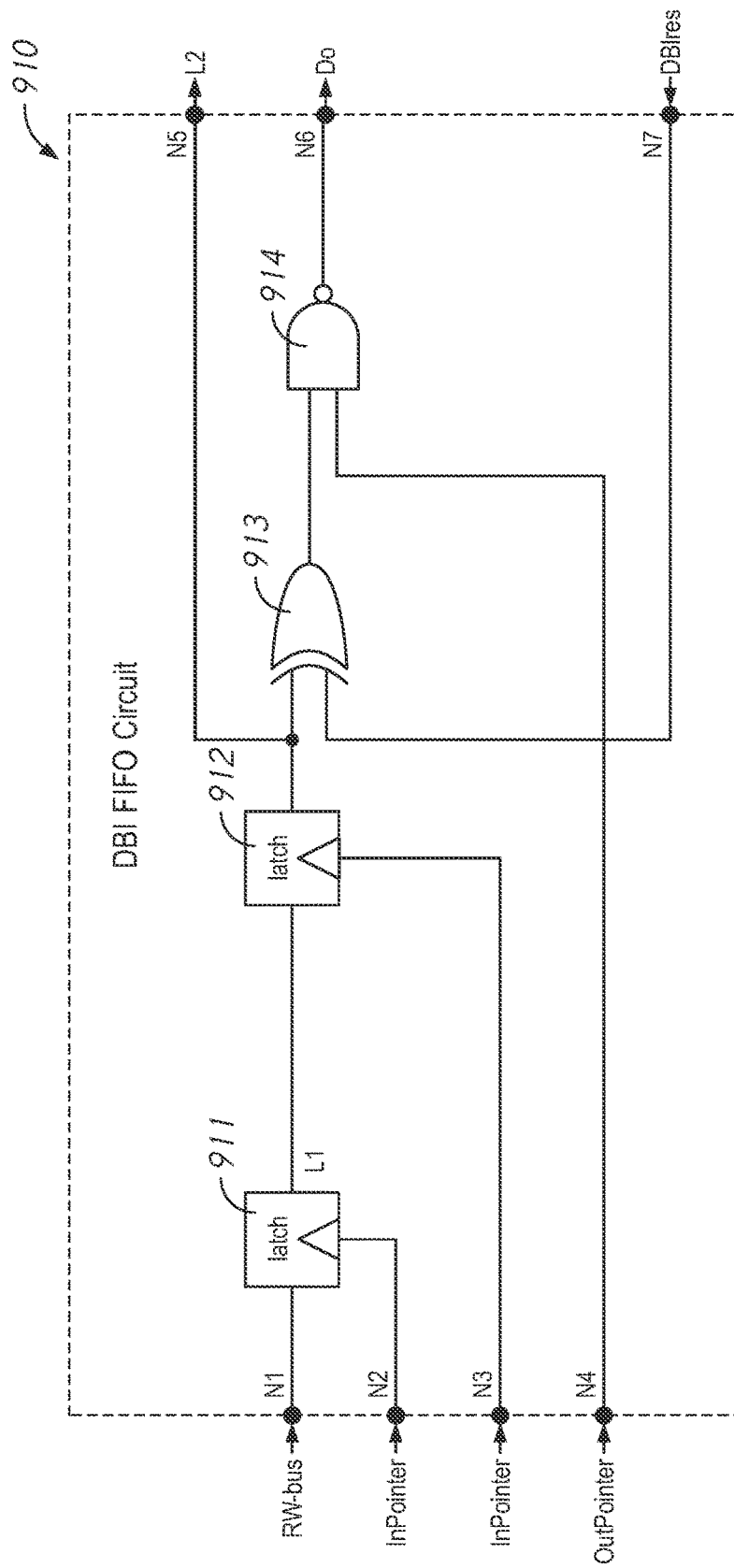
FIG. 9C is a circuit diagram of a DBI First-In First-Out (FIFO) circuit in accordance with an embodiment of the present disclosure.

FIG. 9C is a circuit diagram of a DBI FIFO circuit 910 in accordance with an embodiment of the present disclosure. For example, the DBI FIFO circuit 910 may be each DBI FIFO circuit of the plurality of DBI FIFO A, B, C and D circuits <7:0> 91*a*, 91*b*, 91*c* and 91*d* in FIG. 9A. The DBI FIFO circuit 910 may include two latch circuits 911 and 912, a bit inverter (e.g., XOR circuit) 913 and a NAND circuit 914. For example, the latch circuits 911 may latch (e.g., temporarily store) a corresponding bit of the data on the corresponding RW-bus <7:0> on a node N1 in response to InPointer signal on a node N2, and may further provide a signal L1 to the latch circuit 912. The latch circuit 912 may latch (e.g., temporarily store) the signal L1 from the latch circuit 911 responsive to another InPointer signal on a node N3. The latch circuit 912 may provide a signal L2 on a node N5 and further to the bit inverter 913 that may receive DBIres signal at a node N7. The bit inverter 913 may provide an output signal to an NAND circuit 914 that may also receive OutPointer signal on a node N4. The NAND circuit 914 may provide a corresponding bit of output data Do to a node N6.

Figure 9E:
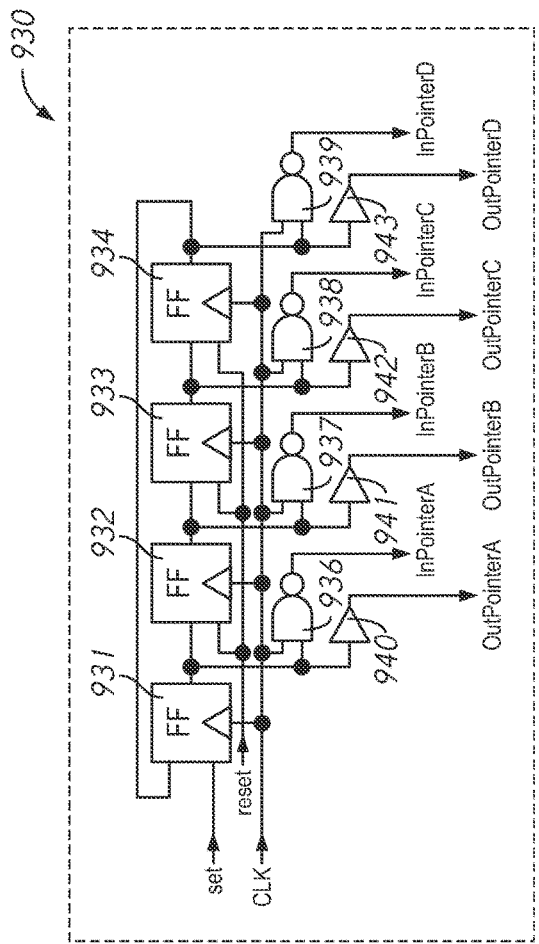
FIG. 9E is a circuit diagram of a pointer in accordance with an embodiment of the present disclosure.
Figure 9F:
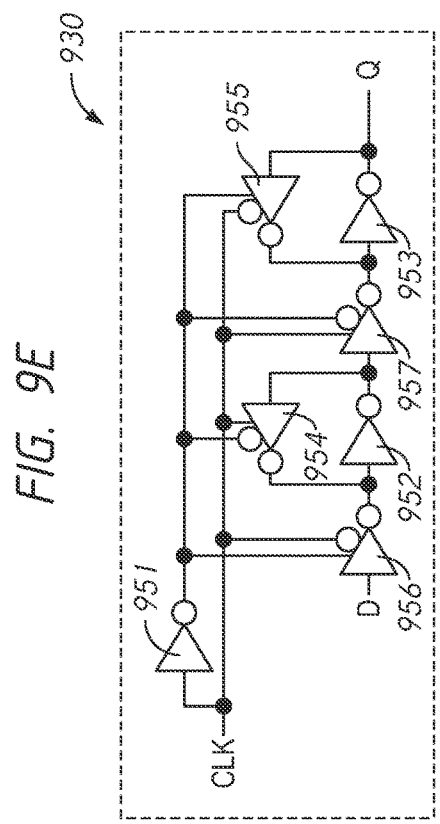
FIG. 9F is a circuit diagram of a flip-flop (FF) circuit in accordance with an embodiment of the present disclosure.
Figure 9D:
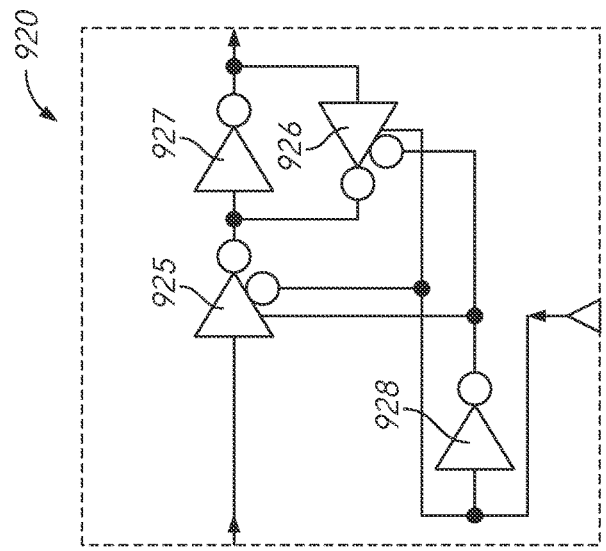
FIG. 9D is a circuit diagram of a latch circuit in accordance with an embodiment of the present disclosure.

FIG. 9D is a circuit diagram of a latch circuit 920 in accordance with an embodiment of the present disclosure. For example, the latch circuit 920 may be used as the latch circuits 911 and 912. The latch circuit 920 may include two clocked inverter circuits 925 and 926 and two inverters 927 and 928. FIG. 9E is a circuit diagram of a pointer 930 in accordance with an embodiment of the present disclosure. For example, the pointer 930 may be the pointer 93 in FIG. 9A. The pointer 930 may include a plurality of flip-flop (FF) circuits 931-934, a plurality of NAND circuits 936-939 and a plurality of buffers 940-943, as shown in FIG. 9E. The plurality of flip-flop (FF) circuits 931-934 may provide output signals to the plurality of NAND circuits 936-939 and the plurality of buffers 940-943, respectively. The plurality of NAND circuits 936-939 may provide the InPointerA-D signals in FIG. 9B responsive to the clock signal CLK. The plurality of buffers 940-943 may provide the OutPointerA-D signals in FIG. 9B. FIG. 9F is a circuit diagram of an FF circuit 950 in accordance with an embodiment of the present disclosure. For example, the FF circuit 950 may be each FF circuit of the plurality of FF circuits 931-935. For example, The FF circuit 950 may include three inverters 951-953 and four clocked inverters 954-957.

Figure 9G:
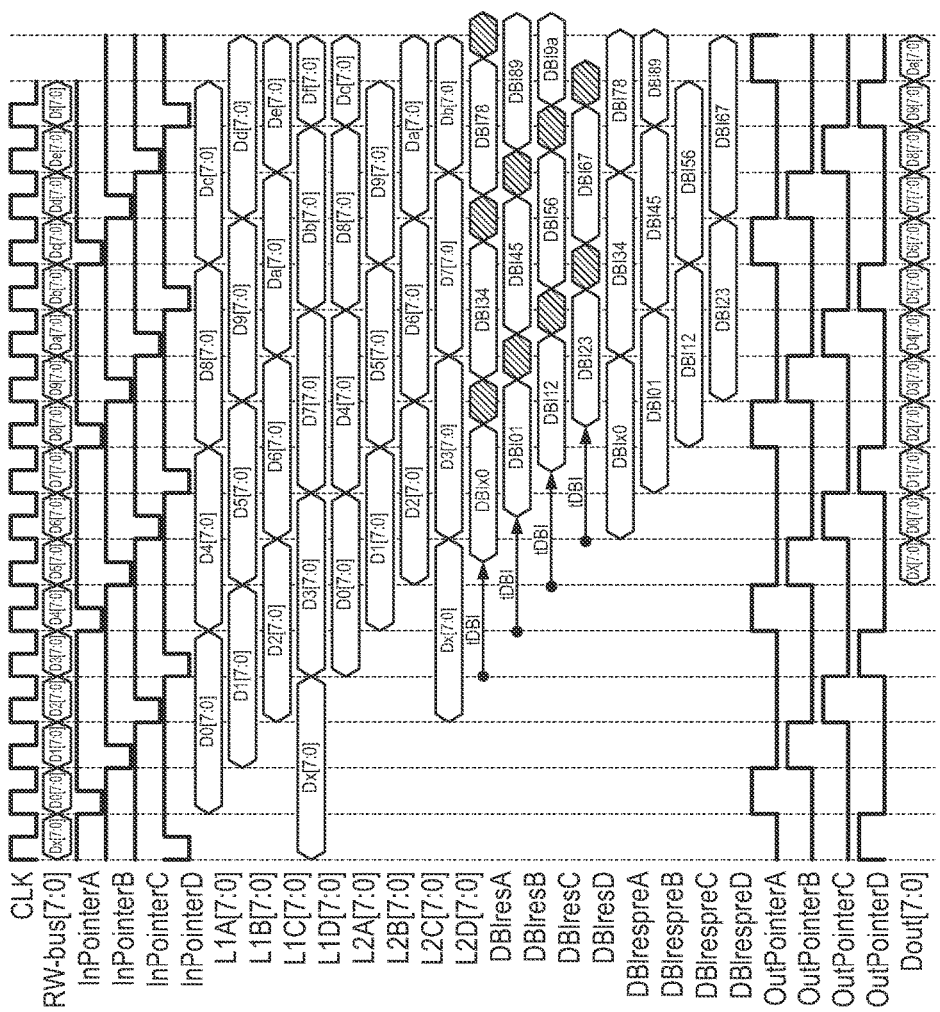
FIG. 9G is a timing diagram of signals in the DBI circuit during a DBI operation in accordance with an embodiment of the present disclosure.

FIG. 9G is a timing diagram of signals in the DBI circuit 9 during a DBI operation in accordance with an embodiment of the present disclosure. With the above configurations, the DBI circuit 9 may perform a DBI operation on the current input data and the previous input data. The plurality of DBI FIFO A circuits <7:0> 91a, the plurality of DBI FIFO B circuits <7:0> 91b, the plurality of DBI FIFO C circuits <7:0> 91c and the plurality of DBI FIFO D circuits <7:0> 91d may internally latch common input data D0-D7[7:0] from the RW-bus <7:0> (e.g., at the latch circuits 911) responsive to InPointerA, InPointerB, InPointerC and InPointerD signals from the pointer circuit 93 and may provide a string of data D0[7:0], D1[7:0], D2[7:0], D3[7:0] as L1A-L1D signals, respectively. The plurality of DBI FIFO A circuits <7:0> 91a, the plurality of DBI FIFO B circuits <7:0> 91b, the plurality of DBI FIFO C circuits <7:0> 91c and the plurality of DBI FIFO D circuits <7:0> 91d may internally latch the L1A-L1D signals (e.g., at the latch circuits 912) responsive to InPointerD, InPointerA, InPointerB and InPointerC signals from the pointer circuit 93, and may provide the string of data D0[7:0], D1[7:0], D2[7:0], D3[7:0] as L2A-L2D signals, respectively, with a delay of three clock cycles. Furthermore, the plurality of DBI FIFO A circuits <7:0> 91a, the plurality of DBI FIFO B circuits <7:0> 91b, the plurality of DBI FIFO C circuits <7:0> 91c and the plurality of DBI FIFO D circuits <7:0> 91d may internally provide the L2A-L2D signals responsive to the DBI calculation result signals DBIres (e.g., at the bit inverters 913) with a delay of the DBI calculation cycle (tDBI). Finally, the plurality of DBI FIFO A circuits <7:0> 91a, the plurality of DBI FIFO B circuits <7:0> 91b, the plurality of DBI FIFO C circuits <7:0> 91c and the plurality of DBI FIFO D circuits <7:0> 91d may provide output data signals Dout[7:0] responsive to the OutPointerA, OutPointerB, OutPointerC and OutPointerD signals (e.g., at the NAND circuit 914).

Logic levels of signals used in the embodiments described the above are merely examples. However, in other embodiments, combinations of the logic levels of signals other than those specifically described in the present disclosure may be used without departing from the scope of the present disclosure.

Although embodiments of the disclosure have been described, it will be understood by those skilled in the art that the disclosure extends beyond the specifically disclosed embodiments to other alternative embodiments and/or uses and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of other embodiments of the disclosure. Thus, it is intended that the scope of the disclosure should not be limited by the particular disclosed embodiments described above.

What is claimed is:

1. An apparatus comprising:
a data bus inversion (DBI) circuit configured to receive a string of input data including first input data, second input data following the first input data and third input data following the second input data, and further configured to provide a string of output data including first output data, second output data following the first output data and third output data following the second output data, which are either with or without data bus inversion, the DBI circuit including:
a first circuit configured to temporarily latch the first input data and further configured to latch the third input data;
a second circuit configured to temporarily latch the second input data;
a first DBI calculator circuit configured to perform first DBI calculation on the latched first input data and the latched second input data responsive to the first circuit latching the first input data and the second circuit latching the second input data, respectively; and
a second DBI calculator circuit configured to perform second DBI calculation on the latched second data and the latched third input data responsive to the first circuit latching the third input data.

2. The apparatus of claim 1, wherein the first circuit comprises a first flip-flop (FF) circuit and a second FF circuit coupled in series;
wherein the first FF circuit is configured to store the first input data,
wherein the second FF circuit is configured to store the first input data responsive to the second circuit latching the second input data, and
wherein the first FF circuit is configured to store the third input data.

3. The apparatus of claim 2, wherein the first DBI calculator circuit is coupled to the second FF circuit and further coupled to the second circuit, and
wherein the second DBI calculator circuit is coupled to the first FF circuit and further coupled to the second circuit.

4. The apparatus of claim 1, wherein the first circuit comprises a plurality of first first-in first-out (FIFO) circuits and a plurality of second FIFO circuits,
wherein the second circuit comprises a plurality of third FIFO circuits, and
wherein the plurality of first FIFO circuits, the plurality of second FIFO circuits and the plurality of third FIFO circuits are coupled to an input data bus that is configured to transmit the string of input data in order to temporarily latch the first, third and second input data, respectively.

5. The apparatus of claim 4, wherein the first DBI calculator circuit is configured to be coupled to the first FIFO circuits and further configured to be coupled to the plurality of third FIFO circuits; and
wherein the second DBI calculator circuit is configured to be coupled to the second FIFO circuits and further configured to be coupled to the third FIFO circuits.

6. An apparatus comprising:
a first plurality of FIFO circuits configured to receive at least a first portion of a plurality of corresponding bits of data and a first pointer signal, and further configured to provide a plurality of corresponding bits of first latched data responsive to the first pointer signal;
a second plurality of FIFO circuits configured to receive at least a second portion of the plurality of corresponding bits of data and a second pointer signal, and further configured to provide a plurality of corresponding bits of second latched data responsive to the second pointer signal;

a DBI calculator configured to receive the plurality of corresponding bits of the first latched data and the plurality of corresponding bits of the second latched data and further configured to provide a current DBI calculation result signal after a DBI calculation cycle, wherein each FIFO circuit of the first plurality of FIFO circuits includes:

an input circuit configured to receive a corresponding bit of the data and the first pointer signal, and further configured to latch the corresponding bit of the data responsive to the first pointer signal to provide a corresponding bit of the first latched data;

a bit inverter configured to receive the corresponding bit of the first latched data and the current DBI calculation result signal, and configured to provide the corresponding bit of the first latched data with or without inversion as a bit inverter output signal responsive to the current DBI calculation result signal; and a logic circuit coupled to the bit inverter, and configured to provide the bit inverter output signal responsive to a delayed first pointer signal that has a delay of a DBI calculation cycle with reference to the first pointer signal.

7. The apparatus of claim 6, further comprising a plurality of pre-DBI latch circuits configured to receive the plurality of corresponding bits of the second latched data and further configured to provide the plurality of corresponding bits of the second latched data responsive to the first pointer signal, wherein the DBI calculator is configured to receive the plurality of corresponding bits of the second latched data from the plurality of pre-DBI latch circuits responsive to the first pointer signal.

8. The apparatus of claim 6, wherein the input circuit in each FIFO circuit of the first plurality of FIFO circuits is a first FF circuit, and wherein the logic circuit includes:

a second FF circuit configured to latch the bit inverter output signal responsive to the delayed first pointer signal; and a NAND circuit configured to provide the bit inverter output signal responsive to the delayed first pointer signal in an active state.

9. The apparatus of claim 6, wherein the logic circuit includes a NAND circuit configured to provide the bit inverter output signal responsive to the delayed first pointer signal in an active state, and wherein the delayed first pointer signal is the second pointer signal.

10. The apparatus of claim 6, further comprising an input data bus configured to transmit the plurality of corresponding bits of data including the first portion of the plurality of corresponding bits of data and the second portion of the plurality of corresponding bits of data, wherein the first plurality of FIFO circuits are configured to receive the at least the first portion of the plurality of corresponding bits of data from the input data bus, and wherein the second plurality of FIFO circuits are configured to receive the at least the second portion of the plurality of corresponding bits of data from the input data bus.

11. The apparatus of claim 6, further comprising:

a first input data bus configured to transmit the plurality of corresponding bits of data including the first portion of the plurality of corresponding bits of data; and a second input data bus configured to transmit the second portion of the plurality of corresponding bits of data, wherein the first plurality of FIFO circuits are configured to receive the at least the first portion of the plurality of corresponding bits of data from the first input data bus, and wherein the second plurality of FIFO circuits are configured to receive the at least the second portion of the plurality of corresponding bits of data from the second input data bus.

12. The apparatus of claim 11, further comprising a serializer circuit configured to receive the plurality of corresponding bits of first latched data with or without inversion and the plurality of corresponding bits of the second latched data with or without inversion, and further configured to provide the plurality of corresponding bits of first latched data with or without inversion and the plurality of corresponding bits of second latched data with or without inversion alternatingly in series responsive to a clock signal.

13. The apparatus of claim 12, further comprising:

a third plurality of FIFO circuits configured to receive the at least the first portion of the plurality of corresponding bits of data from the first input data bus; and a fourth plurality of FIFO circuits configured to receive the at least the second portion of the plurality of corresponding bits of data from the second input data bus, wherein the logic circuit in each FIFO circuit of the first plurality of FIFO circuits is configured to receive a combination of the first pointer signal and the second pointer signal.

14. The apparatus of claim 6, wherein the DBI calculator includes:

an input stage including:

a plurality of comparators, wherein each comparator of the plurality of comparators is configured to receive a corresponding bit of the first latched data and a corresponding bit of the second latched data, further configured to provide a comparison result signal indicative of a change from the corresponding bit of the first latched data to the corresponding bit of the second latched data; and a plurality of first logic circuits configured to receive the comparison result signals from the plurality of comparators and further configured to provide a plurality of first intermediate signals;

an intermediate stage including a plurality of second logic circuits configured to receive the plurality of first intermediate signals and configured to provide a plurality of second intermediate signals; and an output stage including an evaluation circuit configured to receive the second intermediate signals and configured to provide a current DBI calculation result signal indicative of whether a majority of bits of the data are different a majority of bits of immediately preceding data.

15. The apparatus of claim 14, wherein the input circuit in each FIFO circuit of the first plurality of FIFO circuits is a first FF circuit, wherein the plurality of first logic circuits comprises a plurality of third FF circuits configured to provide the plurality of first intermediate signals responsive to an inverted signal of the first pointer signal.

16. The apparatus of claim 15, wherein each FIFO circuit of the first plurality of FIFO circuits further includes a fourth FF circuit, and wherein the fourth FF circuit is configured to receive the first latched data and the inverted signal of the first pointer signal and configured to provide a third latched data responsive to the inverted signal of the first pointer signal.

17. The apparatus of claim 16, wherein the plurality of second logic circuits comprises a plurality of fifth FF circuits configured to provide the plurality of second intermediate signals responsive to the first pointer signal, wherein each FIFO circuit of the first plurality of FIFO circuits further includes a sixth FF circuit, and wherein the plurality of third FF circuits is configured to receive the third latched data and the first pointer signal and configured to provide a fourth latched data responsive to the first pointer signal.

18. A method of data bus inversion including:

receiving at least a first portion of a plurality of corresponding bits of data and a first pointer signal, which includes receiving a corresponding bit of the data and the first pointer signal;

providing a plurality of corresponding bits of first latched data responsive to the first pointer signal, which includes latching the corresponding bit of the data responsive to the first pointer signal to provide a corresponding bit of the first latched data;

receiving at least a second portion of the plurality of corresponding bits of data and a second pointer signal;

providing a plurality of corresponding bits of second latched data responsive to the second pointer signal;

receiving the plurality of corresponding bits of the first latched data and the plurality of corresponding bits of the second latched data;

providing a current DBI calculation result signal after a DBI calculation cycle responsive to the plurality of corresponding bits of the first latched data and the plurality of corresponding bits of the second latched data;

receiving the corresponding bit of the first latched data and the current DBI calculation result signal;

providing the corresponding bit of the first latched data with or without inversion as a bit inverter output signal responsive to the current DBI calculation result signal; and providing the bit inverter output signal responsive to a delayed first pointer signal, wherein the delayed first pointer signal has a delay of a DBI calculation cycle with reference to the first pointer signal.

19. The method of claim 18, wherein the delayed first pointer signal is the second pointer signal.

20. The method of claim 18, wherein the delayed first pointer signal is a combination of the first pointer signal and the second pointer signal.

* * * * *